United States Patent
Yukawa et al.

(10) Patent No.: US 9,348,222 B2
(45) Date of Patent: May 24, 2016

(54) POSITIVE RESIST COMPOSITION AND METHOD FOR PRODUCTION OF MICROLENS

(75) Inventors: Shojiro Yukawa, Funabashi (JP); Takahiro Kishioka, Funabashi (JP); Takahiro Sakaguchi, Funabashi (JP); Hiroyuki Soda, Funabashi (JP)

(73) Assignee: NISSAN CHEMICAL INDUSTRIES, LTD., Tokyo (JP)

(*) Notice: Subject to any disclaimer, the term of this patent is extended or adjusted under 35 U.S.C. 154(b) by 521 days.

(21) Appl. No.: 12/996,684

(22) PCT Filed: Jul. 7, 2009

(86) PCT No.: PCT/JP2009/062379
§ 371 (c)(1),
(2), (4) Date: Dec. 7, 2010

(87) PCT Pub. No.: WO2010/007915
PCT Pub. Date: Jan. 21, 2010

(65) Prior Publication Data
US 2011/0086310 A1  Apr. 14, 2011

(30) Foreign Application Priority Data
Jul. 16, 2008  (JP) ................. 2008-184524

(51) Int. Cl.
*G03F 7/023* (2006.01)
*G03F 7/09* (2006.01)
*C08F 2/48* (2006.01)
*C08F 212/32* (2006.01)
*C09D 125/08* (2006.01)
*G02B 3/00* (2006.01)
*G03F 7/40* (2006.01)

(52) U.S. Cl.
CPC ............ *G03F 7/0233* (2013.01); *C08F 2/48* (2013.01); *C08F 212/32* (2013.01); *C09D 125/08* (2013.01); *G03F 7/094* (2013.01); *G02B 3/0012* (2013.01); *G03F 7/40* (2013.01)

(58) Field of Classification Search
CPC ........... G03F 7/004; G03F 7/022; G03F 7/20; G03F 7/0233
USPC ...................... 430/270.1, 326, 910
See application file for complete search history.

(56) References Cited

U.S. PATENT DOCUMENTS

| | | | | |
|---|---|---|---|---|
| 3,188,210 | A * | 6/1965 | Fritz et al. .............. | 430/193 |
| 4,910,119 | A * | 3/1990 | Schneller et al. .............. | 430/192 |
| 5,114,816 | A * | 5/1992 | Scheler et al. ................ | 430/192 |
| 5,324,623 | A * | 6/1994 | Tsumori ........................ | 430/321 |
| 5,362,599 | A * | 11/1994 | Knors et al. .................. | 430/192 |
| 5,401,614 | A | 3/1995 | Dichiara et al. | |
| 5,928,841 | A * | 7/1999 | Ushirogouchi et al. ...... | 430/325 |
| 6,534,235 | B1 * | 3/2003 | Hanabata et al. ............. | 430/191 |
| 2002/0047567 | A1 * | 4/2002 | Fujita et al. ................ | 315/169.3 |
| 2004/0127595 | A1 | 7/2004 | Nomura et al. | |
| 2006/0192915 | A1 * | 8/2006 | Kimura ......................... | 349/151 |
| 2006/0229384 | A1 * | 10/2006 | Sakayori ....................... | 523/160 |

FOREIGN PATENT DOCUMENTS

| | | |
|---|---|---|
| CN | 1512268 A | 7/2004 |
| CN | 1904736 A | 1/2007 |
| CN | 1964060 A | 5/2007 |
| EP | 1 079 244 A2 | 2/2001 |
| EP | 1 433 595 A2 | 6/2004 |
| JP | A-63-165846 | 7/1988 |
| JP | A-08-048725 | 2/1996 |
| JP | A-2001-042518 | 2/2001 |
| JP | A-2005-091479 | 4/2005 |
| JP | A-2005-114968 | 4/2005 |
| KR | 10-0150440 B1 | 10/1998 |

OTHER PUBLICATIONS

Chinese Office Action issued in Chinese Application No. 200980126272.3 (with translation), Feb. 21, 2012.
International Search Report issued in Application No. PCT/JP2009/062379; Dated Aug. 4, 2009 (With Translation).
Dec. 7, 2011 Extended Search Report issued in European Patent Application No. 09797841.5.
Dec. 21, 2015 Notice of Office Action issued in Korean Application No. 10-2011-7003508.

* cited by examiner

*Primary Examiner* — Anca Eoff
(74) *Attorney, Agent, or Firm* — Oliff PLC

(57) ABSTRACT

There is provided a positive resist composition excellent in transparency, heat resistance, and refractive index particularly for forming a microlens and for forming a planarization film; and a microlens and a planarization film formed from the positive resist composition. A positive resist composition comprising a component (A): an alkali-soluble polymer comprising a unit structure having a biphenyl structure; a component (B): a compound having an organic group to be photolyzed to generate an alkali-soluble group; and a component (C): a solvent. The positive resist composition wherein the alkali-soluble polymer as the component (A) is a polymer comprising a unit structure of Formula (1):

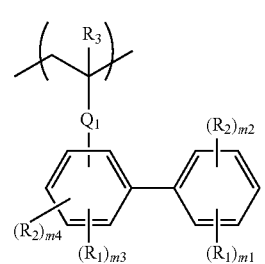

Formula (1)

where when the total number of unit structures constituting the polymer (A) is assumed to be 1.0, the ratio n1 of the unit structure of Formula (1) constituting the polymer (A) satisfies $0.3 \leq n1 \leq 1.0$.

4 Claims, No Drawings

POSITIVE RESIST COMPOSITION AND METHOD FOR PRODUCTION OF MICROLENS

TECHNICAL FIELD

The present invention relates to a positive resist composition containing a copolymer having a vinylbiphenyl, and a microlens and a planarization film formed from the positive resist composition.

BACKGROUND ART

A microlens for an imaging device such as a charge coupled device (CCD) can produce a high-definition imaging device mainly by forming a fine pattern and is produced using a method for forming a pattern by a photoresist. In this method, a microlens is produced by a method including: applying a resist composition containing a polymer resin and a photosensitizer on a substrate to make a film of the resist composition; patterning the resultant film by a photolithography method; and developing the film to form one pattern. For the formed microlens pattern, there are required high transparency and heat resistance because the microlens is exposed to a high temperature condition in a soldering process. Further, for the microlens pattern, it is required to have a desired curvature radius and a high refractive index from the viewpoint of the resolution.

In an optical device such as a liquid crystal display device, an LED display device, and a solid-state imaging device, there is used a planarization film for planarizing a substrate surface and a solid-state imaging device surface of a color filter or the like. For the planarization film, planarizing properties, adhesion to a substrate surface and an element surface, and light transmittance (transparency) are required, and further, for preventing the exposure of a substrate surface and an element surface to heat during a production process of an optical device, a function as a protecting film having heat resistance is also required.

As a resist composition for forming the microlens as described above, there is disclosed a resist composition using a polymer having, as a repeating unit, hydroxystyrene, hydroxyvinylnaphthalene, or hydroxyanthracene in which hydrogen atoms of hydroxy groups are partially substituted with an acid unstable group (for example, Patent Document 1). However, a pattern formed from such a resist composition does not have heat resistance sufficient for an imaging device application.

On the other hand, as a high refractive index resin for optical materials having high heat resistance, there is disclosed a high refractive index resin for optical materials containing a copolymer produced by copolymerizing a single type or a plurality of types of vinyl monomer radical-polymerizable with 4-vinylbiphenyl (for example, Patent Document 2). However, though this high refractive index resin for optical materials has high heat resistance and a high refractive index, the resin does not have a resolution sufficient for an imaging device application.

RELATED-ART DOCUMENT

Patent Document

Patent Document 1: Japanese Patent Application Publication No. JP-A-2005-114968

Patent Document 2: Japanese Patent Application Publication No. JP-A-8-48725

DISCLOSURE OF THE INVENTION

Problem to be Solved by the Invention

In order to solve the problems described above, it is an object of the present invention to provide: a positive resist composition excellent in transparency, heat resistance, and refractive index particularly for forming a microlens and for forming a planarization film; and a microlens and a planarization film formed from the positive resist composition.

Means for Solving the Problem

The present invention relates to, according to a first aspect, a positive resist composition containing:

a component (A): an alkali-soluble polymer containing a unit structure having a biphenyl structure;

a component (B): a compound having an organic group to be photolyzed to generate an alkali-soluble group; and a component (C): a solvent.

According to a second aspect, in the positive resist composition according to the first aspect, the alkali-soluble polymer as the component (A) is a polymer containing a unit structure of Formula (1):

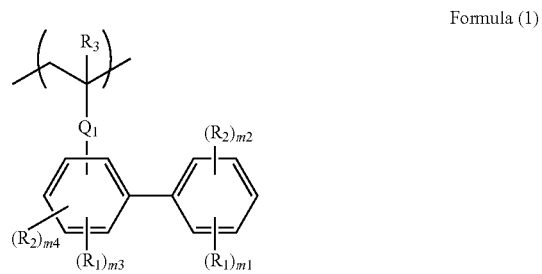

Formula (1)

(where $R_1$ is a halogen atom, an alkyl group, an alkoxy group, a thiol group, a cyano group, an amino group, an amide group, an alkylcarbonyl group, a thioalkyl group, or a combination thereof; $R_2$ is a carboxy group or a hydroxy group; $R_3$ is a hydrogen atom or a methyl group; $Q_1$ is a single bond or a divalent linking group; m2 is an integer of 0 to 5, m4 is an integer of 0 to 4, and (m2+m4) is an integer of 1 to 9; m1 is an integer satisfying $0 \le m1 \le (5-m2)$; and m3 is an integer satisfying $0 \le m3 \le (4-m4)$), where when the total number of unit structures constituting the polymer (A) is assumed to be 1.0, the ratio n1 of the unit structure of Formula (1) constituting the polymer (A) satisfies $0.3 \le n1 \le 1.0$.

According to a third aspect, in the positive resist composition according to the first aspect, the alkali-soluble polymer as the component (A) is a polymer containing a unit structure of Formula (2):

Formula (2)

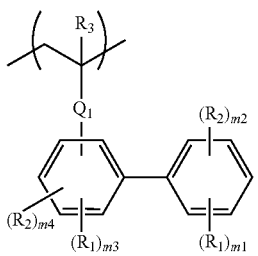

(where $R_1$ is a halogen atom, an alkyl group, an alkoxy group, a thiol group, a cyano group, an amino group, an amide group, an alkylcarbonyl group, a thioalkyl group, or a combination thereof; $R_2$ is a carboxy group or a hydroxy group; $R_3$ is a hydrogen atom or a methyl group; $Q_1$ is a single bond or a divalent linking group; m2 is an integer of 0 to 5, m4 is an integer of 0 to 4, and (m2+m4) is an integer of 0 to 9; m1 is an integer satisfying $0 \le m1 \le (5-m2)$; and m3 is an integer satisfying $0 \le m3 \le (4-m4)$) and a unit structure of Formula (3):

Formula (3)

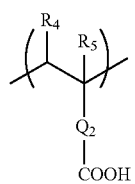

(where $R_4$ and $R_5$ are individually a hydrogen atom, a methyl group, a carboxy group, or a $C_{1-3}$ alkylenecarboxy group; $Q_2$ is a single bond, a $C_{1-3}$ alkylene group, or a $C_{6-20}$ arylene group), where when the total number of all unit structures constituting the polymer (A) is assumed to be 1.0, the ratio n2 of the unit structure of Formula (2) constituting the polymer (A) and the ratio n3 of the unit structure of Formula (3) constituting the polymer (A) satisfy $0.2 \le n2 \le 0.8$, $0.1 \le n3 \le 0.7$, and $0.3 \le n2+n3 \le 1.0$.

According to a fourth aspect, in the positive resist composition according to the first aspect, the alkali-soluble polymer as the component (A) is a polymer containing a unit structure of Formula (1) as described in the second aspect, a unit structure of Formula (4):

Formula (4)

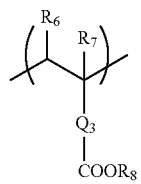

(where $R_6$ and $R_7$ are individually a hydrogen atom, a methyl group, a carboxy group, or a $C_{1-3}$ alkylenecarboxy group; $R_8$ is a $C_{1-10}$ substituted or unsubstituted alkyl group, a $C_{3-6}$ epoxy group, a $C_{6-20}$ aryl group, or a combination thereof; and $Q_3$ is a single bond, a $C_{1-3}$ alkylene group, or a $C_{6-20}$ arylene group), and/or a unit structure of Formula (5):

Formula (5)

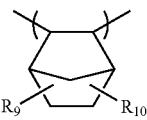

(where $R_9$ and $R_{10}$ are individually a $C_{1-10}$ substituted or unsubstituted alkyl group, a hydroxy group, a halogen group, a carboxy group, or a $C_{1-10}$ alkoxy group), where when the total number of all unit structures constituting the polymer (A) is assumed to be 1.0, the ratio n1 of the unit structure of Formula (1) constituting the polymer (A), the ratio n4 of the unit structure of Formula (4) constituting the polymer (A), and the ratio n5 of the unit structure of Formula (5) constituting the polymer (A) satisfy $0.3 \le n1 \le 0.7$, $0 \le n4 \le 0.4$, $0 \le n5 \le 0.4$, and $0.3 \le n1+n4+n5 \le 1.0$.

According to a fifth aspect, in the positive resist composition according to the first aspect, the alkali-soluble polymer as the component (A) is a polymer further containing, besides a unit structure of Formula (2) as described in the third aspect and a unit structure of Formula (3) as described in the third aspect, a unit structure of Formula (4) as described in the fourth aspect and/or a unit structure of Formula (5) as described in the fourth aspect, where when the total number of all unit structures constituting the polymer (A) is assumed to be 1.0, the ratio n2 of the unit structure of Formula (2) constituting the polymer (A), the ratio n3 of the unit structure of Formula (3) constituting the polymer (A), the ratio n4 of the unit structure of Formula (4) constituting the polymer (A), and the ratio n5 of the unit structure of Formula (5) constituting the polymer (A) satisfy $0.2 \le n2 \le 0.8$, $0.1 \le n3 \le 0.7$, $0 \le n4 \le 0.4$, $0 \le n5 \le 0.4$, and $0.3 \le n2+n3+n4+n5 \le 1.0$.

According to a sixth aspect, in the positive resist composition according to the first aspect, the component (B) is a compound having a structure of Formula (6):

Formula (6)

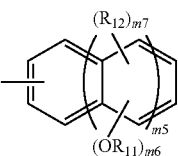

[where $R_{11}$ is a hydrogen atom or a group of Formula (7):

Formula (7)

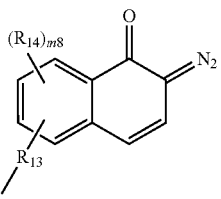

(where $R_{13}$ is a single bond or a —$SO_3$— group; $R_{14}$ is a $C_{1-10}$ alkyl group; and m8 is an integer of 0 to 3); $R_{12}$ is a $C_{1-10}$ substituted or unsubstituted alkyl group, a halogen group, or a $C_{1-10}$ alkoxy group; m5 is an integer of 0 or 1, where when m5 is 0, m6 is an integer of 1 to 5 and m7 is an integer satisfying $0 \le m7 \le (5-m6)$, and when m5 is 1, m6 is an integer of 1 to 7 and m7 is an integer satisfying $0 \le m7 \le (7-m6)$; and $R_{11}$ is a group of Formula (7) in an amount of 10 to 100% by mol, based on the number of moles of all —$OR_{11}$ groups contained in the structure of Formula (6)].

According to a seventh aspect, in the positive resist composition according to the first aspect, the component (B) is a compound of Formula (8):

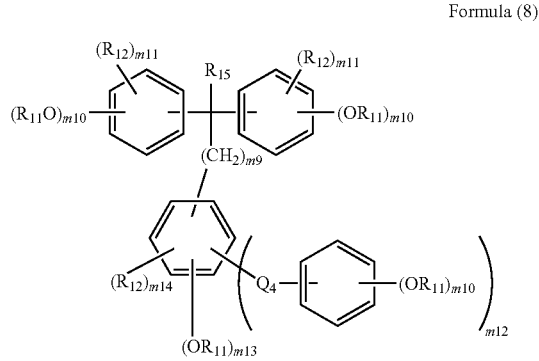

Formula (8)

(where $R_{11}$ and $R_{12}$ are individually the same group as those defined in the above Formula (6); $R_{15}$ is a hydrogen atom or a $C_{1-10}$ alkyl group; $Q_4$ is a $C_{1-10}$ alkylene group; m10 is an integer of 1 to 5; m11 is an integer satisfying $0 \leq m11 \leq (5-m10)$; m14 is an integer satisfying $0 \leq m14 \leq (5-m12-m13)$; m9 is an integer of 0 to 10; m12 is an integer of 0 to 1; m13 is an integer of 0 to 5; and $R_{11}$ is a group of Formula (7) as described in the sixth aspect in an amount of 10 to 100% by mol, based on the number of moles of all —$OR_{11}$ groups contained in the compound of Formula (8)).

According to an eighth aspect, the positive resist composition according to the first aspect contains the component (A) as described in the second aspect to the fifth aspect and the component (B) as described in the sixth aspect or the seventh aspect.

According to a ninth aspect, the positive resist composition according to the eighth aspect further contains, as a component (D), a crosslinkable compound having two or more substituents thereto-crosslinkable with the component (A).

According to a tenth aspect, the positive resist composition according to the eighth aspect further contains, as a component (E), a surfactant.

According to an eleventh aspect, in the positive resist composition according to the first aspect, as coating film properties after curing, a refractive index relative to light having a wavelength is 633 nm of 1.55 or more, and a transmittance relative to light having a wavelength of 400 to 730 nm at a film thickness of 1 μm is 80% or more.

According to a twelfth aspect, a microlens is formed from the positive resist composition as described in the eighth aspect to the eleventh aspect.

According to a thirteenth aspect, a solid-state imaging device contains the microlens as described in the twelfth aspect.

According to a fourteenth aspect, a planarization film is formed from the positive resist composition as described in the eighth aspect to the eleventh aspect.

According to a fifteenth aspect, a liquid crystal display device contains the planarization film as described in the fourteenth aspect.

According to a sixteenth aspect, an LED display device contains the planarization film as described in the fourteenth aspect.

According to a seventeenth aspect, a pattern forming method includes: applying the positive resist composition as described in any one of the eighth aspect to the eleventh aspect on a substrate; and subjecting the resultant coating to drying, exposure to light, and development.

Effects of the Invention

The positive resist composition of the present invention can form a coating film excellent in heat resistance, transparency, and refractive index and a cured film formed by subjecting the coating film to a thermal treatment by using a polymer having a unit structure of a biphenyl or derivatives thereof. The positive resist composition of the present invention can suitably be used also as a material for a microlens and a planarization film.

A cured film obtained according to the present invention has coating film properties of which a refractive index relative to light having a wavelength of 633 nm is 1.55 or more and a transmittance relative to light having a wavelength of 400 to 730 nm at a film thickness of 1 μm is 80% or more.

A microlens formed from the positive resist composition of the present invention can suitably be used as a component member of a solid-state imaging device, and a planarization film formed from the positive resist composition of the present invention can suitably be used as a component member for a liquid crystal display device and an LED display device.

BEST MODES FOR CARRYING OUT THE INVENTION

One aspect of the present invention relates to a positive resist composition containing the following component (A), component (B), and component (C):

a component (A): an alkali-soluble polymer containing a unit structure having a biphenyl structure;

a component (B): a compound having an organic group to be photolyzed to generate an alkali-soluble group; and a component (C): a solvent.

If necessary, the positive resist composition may further contain a component (D): a crosslinkable compound, a component (E): a surfactant, and a component (F): an adhesion accelerator.

Hereinafter, each component is described in detail.

<Component (A)>

The component (A) is an alkali-soluble polymer (hereinafter, called as "polymer (A)") containing a unit structure having a biphenyl structure.

The polymer (A) has such two cases as a case of having an alkali-soluble chemical group in a unit structure having a biphenyl structure and a case having an alkali-soluble chemical group in another unit structure than a unit structure having a biphenyl structure.

The polymer (A) used in the present invention has a number average molecular weight converted into that of polystyrene of 2,000 to 30,000, preferably 2,500 to 15,000, more preferably 3,500 to 10,000.

When the number average molecular weight of the polymer (A) is less than 2,000, pattern forming property, percentage of residual film, and heat resistance of a cured film obtained from the polymer (A) may be lowered. On the other hand, when the number average molecular weight is more than 30,000, there may be caused the lowering of the solubility of the polymer (A) in an organic solvent, the lowering of the applicability of a positive resist composition containing the polymer (A), and the lowering of the resolution due to the remaining of a positive resist composition between microlens patterns after the molding of a microlens pattern.

The polymer (A) of the present invention contains a unit structure of the following Formula (1).

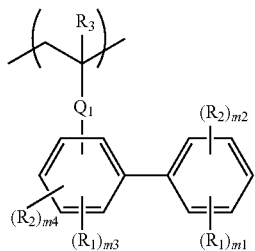

Formula (1)

In Formula (1), $R_1$ is a halogen atom, an alkyl group, an alkoxy group, a thiol group, a cyano group, an amino group, an amide group, an alkylcarbonyl group, a thioalkyl group, or a combination thereof. $R_2$ is a carboxy group or a hydroxy group. $R_3$ is a hydrogen atom or a methyl group. m2 is an integer of 0 to 5, m4 is an integer of 0 to 4, and (m2+m4) is an integer of 1 to 9. m1 is an integer satisfying $0 \leq m1 \leq (5-m2)$, and m3 is an integer satisfying $0 \leq m3 \leq (4-m4)$.

Examples of the halogen atom include a fluorine atom, a chlorine atom, a bromine atom, and an iodine atom.

Examples of the alkyl group include $C_{1-10}$ alkyl groups such as a methyl group, an ethyl group, an n-propyl group, an isopropyl group, a cyclopropyl group, an n-butyl group, an isobutyl group, a sec-butyl group, a tert-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-isopropyl-cyclopropyl group, a 2-isopropyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Examples of the alkoxy group include $C_{1-10}$ alkoxy groups such as a methoxy group, an ethoxy group, an n-propoxy group, an isopropoxy group, an n-butoxy group, an isobutoxy group, a sec-butoxy group, a tert-butoxy group, an n-pentoxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, and a 1-ethyl-2-methyl-n-propoxy group.

Examples of the amino group include, besides —$NH_2$, a $C_{1-10}$ amino group such as a methylamino group, an ethylamino group, an n-propylamino group, an isopropylamino group, a cyclopropylamino group, an n-butylamino group, an isobutylamino group, a sec-butylamino group, a tert-butylamino group, a cyclobutylamino group, a 1-methyl-cyclopropylamino group, a 2-methyl-cyclopropylamino group, an n-pentylamino group, a 1-methyl-n-butylamino group, a 2-methyl-n-butylamino group, a 3-methyl-n-butylamino group, and a 1,1-dimethyl-n-propylamino group.

Examples of the amide group include $C_{1-10}$ amide groups such as a hexaneamide group, a succinimide group, a benzenesulfonamide group, and an N-hydroxyacetamide group.

Examples of the alkylcarbonyl group include $C_{1-10}$ alkylcarbonyl groups such as a methylcarbonyl group, an ethylcarbonyl group, an n-propylcarbonyl group, an isopropylcarbonyl group, a cyclopropylcarbonyl group, an n-butylcarbonyl group, an isobutylcarbonyl group, a sec-butylcarbonyl group, a tert-butylcarbonyl group, a cyclobutylcarbonyl group, a 1-methyl-cyclopropylcarbonyl group, a 2-methyl-cyclopropylcarbonyl group, an n-pentylcarbonyl group, a 1-methyl-n-butylcarbonyl group, a 2-methyl-n-butylcarbonyl group, a 3-methyl-n-butylcarbonyl group, a 1,1-dimethyl-n-propylcarbonyl group, a 1,2-dimethyl-n-propylcarbonyl group, a 2,2-dimethyl-n-propylcarbonyl group, a 1-ethyl-n-propylcarbonyl group, a cyclopentylcarbonyl group, a 1-methyl-cyclobutylcarbonyl group, a 2-methyl-cyclobutylcarbonyl group, a 3-methyl-cyclobutylcarbonyl group, a 1,2-dimethyl-cyclopropylcarbonyl group, a 2,3-dimethyl-cyclopropylcarbonyl group, a 1-ethyl-cyclopropylcarbonyl group, a 2-ethyl-cyclopropylcarbonyl group, an n-hexylcarbonyl group, a 1-methyl-n-pentylcarbonyl group, a 2-methyl-n-pentylcarbonyl group, a 3-methyl-n-pentylcarbonyl group, a 4-methyl-n-pentylcarbonyl group, a 1,1-dimethyl-n-butylcarbonyl group, a 1,2-dimethyl-n-butylcarbonyl group, a 1,3-dimethyl-n-butylcarbonyl group, a 2,2-dimethyl-n-butylcarbonyl group, a 2,3-dimethyl-n-butylcarbonyl group, a 3,3-dimethyl-n-butylcarbonyl group, a 1-ethyl-n-butyl carbonyl group, a 2-ethyl-n-butylcarbonyl group, a 1,1,2-trimethyl-n-propylcarbonyl group, a 1,2,2-trimethyl-n-propylcarbonyl group, a 1-ethyl-1-methyl-n-propylcarbonyl group, a 1-ethyl-2-methyl-n-propylcarbonyl group, a cyclohexylcarbonyl group, a 1-methyl-cyclopentylcarbonyl group, a 2-methyl-cyclopentylcarbonyl group, a 3-methyl-cyclopentylcarbonyl group, a 1-ethyl-cyclobutylcarbonyl group, a 2-ethyl-cyclobutylcarbonyl group, a 3-ethyl-cyclobutylcarbonyl group, a 1,2-dimethyl-cyclobutylcarbonyl group, a 1,3-dimethyl-cyclobutylcarbonyl group, a 2,2-dimethyl-cyclobutylcarbonyl group, a 2,3-dimethyl-cyclobutylcarbonyl group, a 2,4-dimethyl-cyclobutylcarbonyl group, a 3,3-dimethyl-cyclobutylcarbonyl group, a 1-n-propyl-cyclopropylcarbonyl group, a 2-n-propyl-cyclopropylcarbonyl group, a 1-isopropyl-cyclopropylcarbonyl group, a 2-isopropyl-cyclopropylcarbonyl group, a 1,2,2-trimethyl-cyclopropylcarbonyl group, a 1,2,3-trimethyl-cyclopropylcarbonyl group, a 2,2,3-trimethyl-cyclopropylcarbonyl group, a 1-ethyl-2-methyl-cyclopropylcarbonyl group, a 2-ethyl-1-methyl-cyclopropylcarbonyl group, a 2-ethyl-2-methyl-cyclopropylcarbonyl group, and a 2-ethyl-3-methyl-cyclopropylcarbonyl group.

Examples of the thioalkyl group include $C_{1-10}$ thioalkyl groups such as an ethylthio group, a butylthio group, a hexylthio group, and an octylthio group.

In Formula (1), $Q_1$ is a single bond or a divalent linking group. Examples of the divalent linking group include an alkylene group, an ester group, an ether group, an amide group, and a combination thereof. Examples of the alkylene group include divalent organic groups corresponding to the above-exemplified alkyl groups. $Q_1$ is preferably a single bond.

Examples of the monomer for introducing the unit structure of Formula (1) into the polymer include a vinylbiphenyl and derivatives thereof.

As the polymer (A), there can be used a polymer (A-1) in which when the total number of unit structures constituting the polymer (A) is assumed to be 1.0, the ratio n1 of the unit structure of Formula (1) satisfies $0.3 \leq n1 \leq 1.0$.

The polymer (A) of the present invention may contain a unit structure of the following Formula (2) and a unit structure of the following Formula (3).

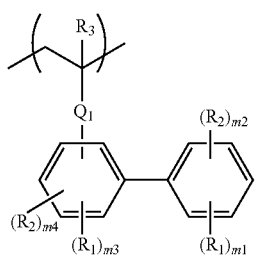

Formula (2)

In Formula (2), $R_1$, $R_2$, $R_3$, m1, m2, m3, and m4 are the same as those exemplified in Formula (1).

Examples of the monomer component for introducing the unit structure of Formula (2) into the polymer include a vinylbiphenyl and derivatives thereof.

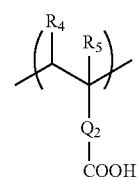

Formula (3)

In Formula (3), $R_4$ and $R_5$ are individually a hydrogen atom, a methyl group, a carboxy group, or a $C_{1-3}$ alkylenecarboxy group.

Examples of the alkylenecarboxy group include a methylenecarboxy group (—CH$_2$COOH), an ethylenecarboxy group (—C$_2$H$_4$COOH), a propylenecarboxy group (—C$_3$H$_6$COOH), and an isopropylenecarboxy group (—CH$_2$CH(CH$_3$)COOH).

Examples of $Q_2$ include a single bond, a $C_{1-3}$ alkylene group, and a $C_{6-20}$ arylene group.

Examples of the $C_{1-3}$ alkylene group include a methylene group, an ethylene group, a propylene group, and an isopropylene group.

Examples of the arylene group include a phenylene group, an o-methylphenylene group, an m-methylphenylene group, a p-methylphenylene group, an o-chlorophenylene group, an m-chlorophenylene group, a p-chlorophenylene group, an o-fluorophenylene group, a p-fluorophenylene group, an o-methoxyphenylene group, a p-methoxyphenylene group, a p-nitrophenylene group, a p-cyanophenylene group, an α-naphthylene group, a β-naphthylene group, a 1-anthrylene group, a 2-anthrylene group, and a 9-anthrylene group.

Examples of the monomer component for introducing the unit structure of Formula (3) into the polymer include acrylic acid, methacrylic acid, itaconic acid, maleic acid, fumaric acid, and vinylbenzoic acid.

As the polymer (A), there can be used a polymer (A-2) in which when the total number of all unit structures constituting the polymer (A) is assumed to be 1.0, the ratio n2 of the unit structure of Formula (2) constituting the polymer (A) and the ratio n3 of the unit structure of Formula (3) constituting the polymer (A) satisfy $0.2 \leq n2 \leq 0.8$, $0.1 \leq n3 \leq 0.7$, and $0.3 \leq n2+n3 \leq 1.0$. The unit structure of Formula (3) has a carboxy group that is alkali-crosslinkable, so that the unit structure of Formula (2) in which (m2+m4) is an integer of 0 to 9 may be either a unit structure having a carboxy group or a unit structure having no carboxy group.

The polymer (A) of the present invention may contain a unit structure of Formula (1), a unit structure of the following Formula (4), and/or a unit structure of the following Formula (5).

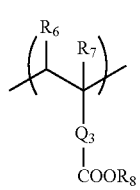

Formula (4)

In Formula (4), $R_6$ and $R_7$ are individually a hydrogen atom, a methyl group, a carboxy group, or a $C_{1-3}$ alkylenecarboxy group. Examples of the $C_{1-3}$ alkylenecarboxy group include the above-exemplified alkylenecarboxy groups.

$R_8$ is a $C_{1-10}$ substituted or unsubstituted alkyl group, a $C_{3-6}$ epoxy group, a $C_{6-20}$ aryl group, or a combination thereof. Examples of the alkyl group include the above-exemplified alkyl groups.

Examples of the $C_{3-6}$ epoxy group include a glycidyl group, an α-methylglycidyl group, a β-methylglycidyl group, a β-ethylglycidyl group, and a β-propylglycidyl group.

Examples of the $C_{6-20}$ aryl group include aryl groups such as a phenyl group, an o-methylphenyl group, an m-methylphenyl group, a p-methylphenyl group, an o-chlorophenyl group, an m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

$Q_3$ is a single bond, a $C_{1-3}$ alkylene group, or a $C_{6-20}$ arylene group. Examples of these groups include those exemplified as $Q_2$ above.

Examples of the monomer for introducing a unit structure of Formula (4) into the polymer include: alkyl esters such as methyl methacrylate, ethyl methacrylate, n-butyl methacrylate, sec-butyl methacrylate, and tert-butyl methacrylate; alkyl esters such as methyl acrylate and isopropyl acrylate; cyclic alkyl esters such as cyclohexyl methacrylate, 2-methylcyclohexyl methacrylate, dicyclopentenyloxyethyl methacrylate, and isobornyl methacrylate; aryl esters such as phenyl methacrylate and benzyl methacrylate; dicarboxylic acid diesters such as diethyl maleate, diethyl fumarate, and diethyl itaconate; hydroxyalkyl esters such as 2-hydroxyethyl methacrylate, 2-hydroxypropyl methacrylate, and 2-hydroxyethyl methacrylate; glycidyl acrylate; glycidyl methacrylate; glycidyl α-ethylacrylate; glycidyl α-n-propylacrylate; glycidyl α-n-butylacrylate; 3,4-epoxybutyl acrylate; 3,4-epoxybutyl methacrylate; 6,7-epoxyheptyl acrylate; 6,7-epoxyheptyl methacrylate; 6,7-epoxyheptyl α-ethylacrylate; o-vinylbenzyl glycidyl ether; m-vinylbenzyl glycidyl ether; and p-vinylbenzyl glycidyl ether.

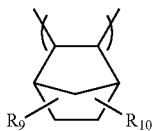

Formula (5)

In Formula (5), $R_9$ and $R_{10}$ are individually a $C_{1-10}$ substituted or unsubstituted alkyl group, a $C_{1-6}$ hydroxyalkyl group, a hydroxy group, a halogen group, a carboxy group, or a $C_{1-10}$ alkoxy group. Examples of the $C_{1-6}$ alkyl group and of the $C_{1-10}$ alkoxy group include those exemplified with respect to Formula (1) above.

Examples of the monomer for introducing a unit structure of Formula (5) into the polymer include bicyclo unsaturated compounds such as bicyclo[2.2.1]hept-2-ene, 5-methyl bicyclo[2.2.1]hept-2-ene, 5-ethyl bicyclo[2.2.1]hept-2-ene, 5-hydroxy bicyclo[2.2.1]hept-2-ene, 5-carboxy bicyclo[2.2.1] hept-2-ene, 5-hydroxymethyl bicyclo[2.2.1]hept-2-ene, 5-(2'-hydroxyethyl)bicyclo[2.2.1]hept-2-ene, 5-methoxy bicyclo[2.2.1]hept-2-ene, 5-ethoxy bicyclo[2.2.1]hept-2-ene, 5,6-dihydroxy bicyclo[2.2.1]hept-2-ene, 5,6-dicarboxy bicyclo[2.2.1]hept-2-ene, 5,6-di(hydroxymethyl)bicyclo [2.2.1]hept-2-ene, 5,6-di(2'-hydroxyethyl)bicyclo[2.2.1] hept-2-ene, 5,6-dimethoxy bicyclo[2.2.1]hept-2-ene, 5,6-diethoxy bicyclo[2.2.1]hept-2-ene, 5-hydroxy-5-methyl bicyclo[2.2.1]hept-2-ene, 5-hydroxy-5-ethyl bicyclo[2.2.1] hept-2-ene, 5-carboxy-5-methyl bicyclo[2.2.1]hept-2-ene, 5-carboxy-5-ethyl bicyclo[2.2.1]hept-2-ene, 5-hydroxymethyl-5-methyl bicyclo[2.2.1]hept-2-ene, 5-carboxy-6-methyl bicyclo[2.2.1]hept-2-ene, 5-carboxy-6-ethyl bicyclo [2.2.1]hept-2-ene, 5,6-dicarboxy bicyclo[2.2.1]hept-2-ene anhydride (himic acid anhydride), 5-tert-butoxycarbonyl bicyclo[2.2.1]hept-2-ene, 5-cyclohexyloxycarbonyl bicyclo [2.2.1]hept-2-ene, 5-phenoxycarbonyl bicyclo[2.2.1]hept-2-ene, 5,6-di(tert-butoxycarbonyl) bicyclo[2.2.1]hept-2-ene, and 5,6-di(cyclohexyloxycarbonyl)bicyclo[2.2.1]hept-2-ene.

As the polymer (A), there can be used a polymer (A-3) in which when the total number of all unit structures constituting the polymer (A) is assumed to be 1.0, the ratio n1 of the unit structure of Formula (1) constituting the polymer (A), the ratio n4 of the unit structure of Formula (4) constituting the polymer (A), and the ratio n5 of the unit structure of Formula (5) constituting the polymer (A) satisfy $0.3 \le n1 \le 0.7$, $0 \le n4 \le 0.4$, $0 \le n5 \le 0.4$, and $0.3 \le n1+n4+n5 \le 1.0$.

The polymer (A) of the present invention may further contain, besides the unit structure of Formula (2) and the unit structure of Formula (3), the unit structure of Formula (4) and/or the unit structure of Formula (5). As the polymer (A), there can be used a polymer (A-4) in which when the total number of all unit structures constituting the polymer (A) is assumed to be 1.0, the ratio n2 of the unit structure of Formula (2) constituting the polymer (A), the ratio n3 of the unit structure of Formula (3) constituting the polymer (A), the ratio n4 of the unit structure of Formula (4) constituting the polymer (A), and the ratio n5 of the unit structure of Formula (5) constituting the polymer (A) satisfy $0.2 \le n2 \le 0.8$, $0.1 \le n3 \le 0.7$, $0 \le n4 \le 0.4$, $0 \le n5 \le 0.4$, and $0.3 \le n2+n3+n4+n5 \le 1.0$.

Specific examples of the polymer (A-1) used in the present invention include Formulae (1-1) to (1-4):

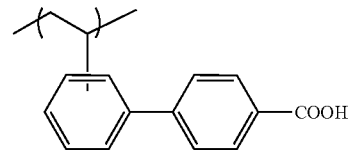

Formula (1-1)

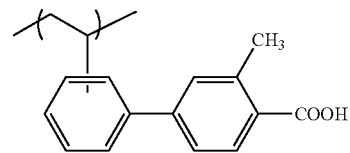

Formula (1-2)

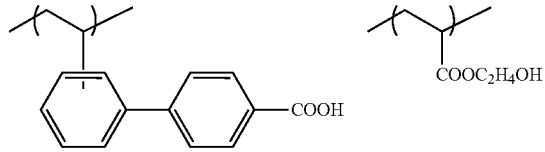

Formula (1-3)

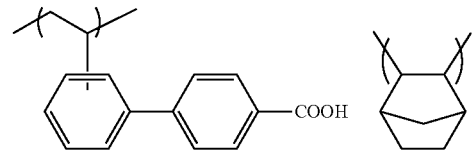

Formula (1-4)

Specific examples of the polymer (A-2) used in the present invention include Formulae (2-1) to (2-8):

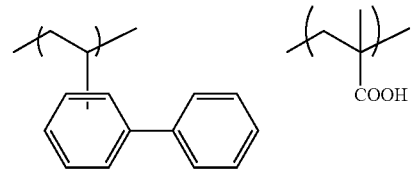

Formula (2-1)

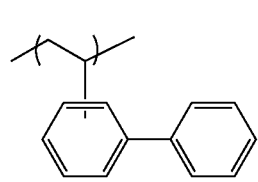 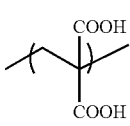 Formula (2-2)
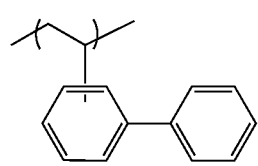 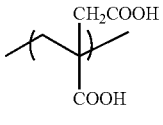 Formula (2-3)
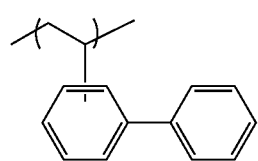 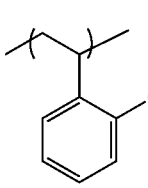 Formula (2-4)
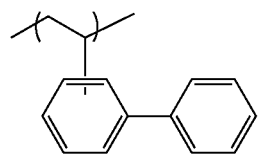 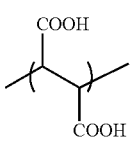 Formula (2-5)
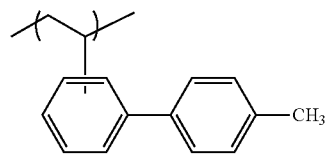 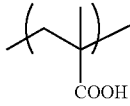 Formula (2-6)
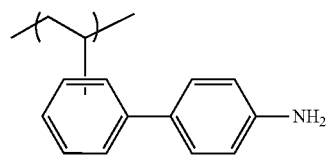 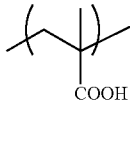 Formula (2-7)
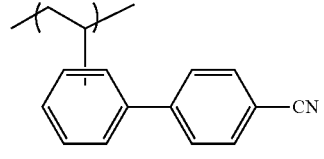 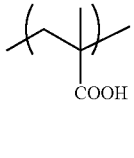 Formula (2-8)
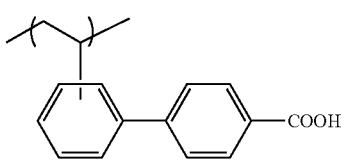 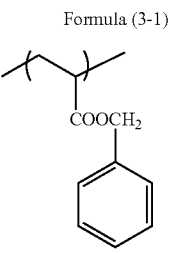 Formula (3-1)
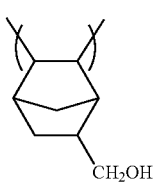
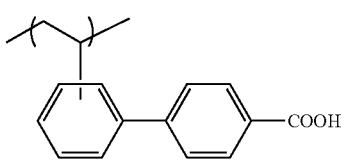 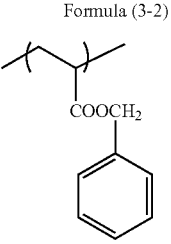 Formula (3-2)
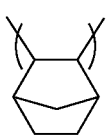
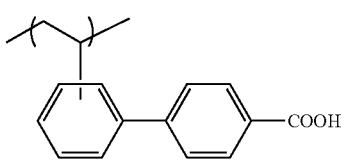 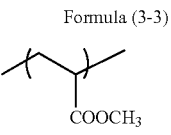 Formula (3-3)
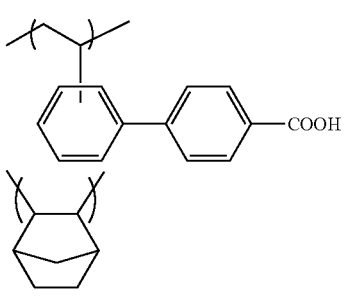 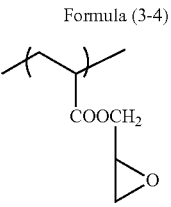 Formula (3-4)
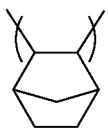
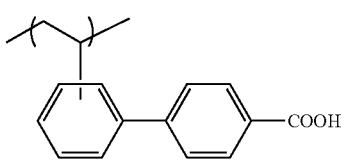 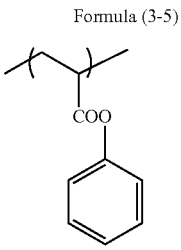 Formula (3-5)
Specific examples of the polymer (A-3) used in the present invention include Formulae (3-1) to (3-5):

-continued

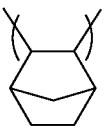

Specific examples of the polymer (A-4) used in the present invention include Formulae (4-1) to (4-3):

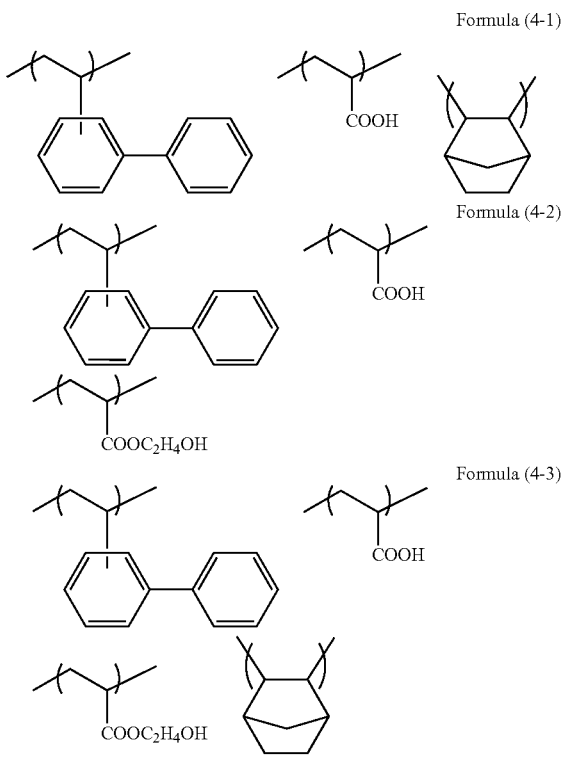

The polymer (A) used in the present invention can be produced by copolymerizing, besides the above monomers, an arbitrary unsaturated monomer. Examples of such an unsaturated monomer include an acrylamide compound, a methacrylamide compound, a styrene compound, and a maleimide compound.

Examples of the acrylamide compound include acrylamide, N-methylacrylamide, N-ethylacrylamide, N-benzylacrylamide, N-phenylacrylamide, and N,N-dimethylacrylamide.

Examples of the methacrylamide compound include methacrylamide, N-methylmethacrylamide, N-ethylmethacrylamide, N-benzylmethacrylamide, N-phenylmethacrylamide, and N,N-dimethylmethacrylamide.

Examples of the styrene compound include styrene, methylstyrene, chlorostyrene, bromostyrene, and hydroxystyrene.

Examples of the maleimide compound include maleimide, N-methylmaleimide, N-phenylmaleimide, and N-cyclohexylmaleimide.

The method of producing the polymer (A) used in the present invention is not particularly limited. Generally, the polymer (A) is produced by radical-polymerizing the above monomer used for producing the polymer (A) in a polymerization solvent. If necessary, the polymerization may be performed in such a manner that a monomer in which a functional group is protected is polymerized and the polymerized product is subjected to a deprotection treatment.

Examples of the radical polymerization catalyst include azo-type polymerization initiators such as azobisisobutyronitrile and dimethyl azobisisobutyrate. The polymerization initiator may be used, for example, in an amount ranging from 0.1% by mol to 20% by mol, based on the total number of moles of all monomers.

Specific examples of the polymerization solvent include the solvents exemplified in <Component (C)> below.

<Component (B)>

As the component (B) that is a compound having an organic group to be photolyzed to generate an alkali-soluble group, there can be used a 1,2-naphthoquinone diazide compound having a partial structure of Formula (6).

When a coating film formed from a positive resist composition containing a 1,2-naphthoquinone diazide compound as the component (B) is subjected to exposure and development using a photomask, a 1,2-naphthoquinone diazide group in an exposed portion of the coating film is converted into ketene by being irradiated with light. The resultant ketene has high reactivity, so that the ketone reacts with a water content to generate a carboxy group. That is, in the coating film containing a 1,2-naphthoquinone diazide compound in an exposed portion, a 1,2-naphthoquinone diazide group generates an indene carboxylic acid group by exposure, so that the coating film becomes soluble in an alkaline developer. Thus, the coating film in an exposed portion and the coating film in an unexposed portion become different from each other in the solubility in an alkaline developer, so that a pattern can be formed. In order to suppress the influence of a standing wave on the pattern shape, or in order to adjust the crosslinking degree of the below-described crosslinkable compound (D) with the polymer (A) or the 1,2-naphthoquinone diazide compound (B), a post exposure bake (PEB) can be performed.

The component (B) may have a partial structure of Formula (6):

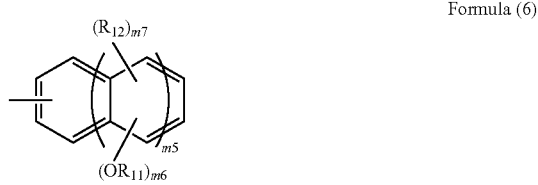

Formula (6)

In Formula (6), $R_{11}$ is a hydrogen atom or a group of the following Formula (7). $R_{12}$ is a substituent bonded to the ring such as a $C_{1-10}$ substituted or unsubstituted alkyl group, a halogen group, and a $C_{1-10}$ alkoxy group, and examples of these groups include those exemplified above. m5 is 0 or 1. When m5 is 0, the partial structure of Formula (6) is a benzene ring and when m5 is 1, the partial structure is a naphthalene ring. When m5 is 0, m6 is an integer of 1 to 5 and m7 is an integer satisfying 0≤m7≤(5−m6), and when m5 is 1, m6 is an integer of 1 to 7 and m7 is an integer satisfying 0≤m7≤(7−m6).

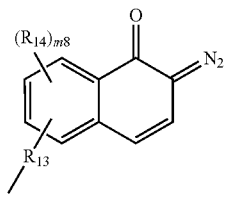

Formula (7)

In Formula (7), $R_{13}$ is a single bond or a —$SO_3$— group. $R_{14}$ is a $C_{1-10}$ alkyl group, and examples thereof include those exemplified above. m8 is an integer of 0 to 3.

As the compound for introducing the group of Formula (7) into the component (B), when 5-hydroxy-1,2-naphthoquinone diazide is used, $R_{13}$ is a single bond, and when 1,2-naphthoquinone diazide-5-sulfonyl chloride or 1,2-naphthoquinone diazide-4-sulfonyl chloride is used, $R_{13}$ is a —$SO_2$— group.

In the compound (B), $R_{11}$ is a 1,2-naphthoquinone diazide group of Formula (7) or derivatives thereof in an amount of 10 to 100% by mol, preferably 20 to 95% by mol, based on the number of moles of all —$OR_{11}$ groups contained in the structure of Formula (6).

As the compound (B), a compound of Formula (8) can be used.

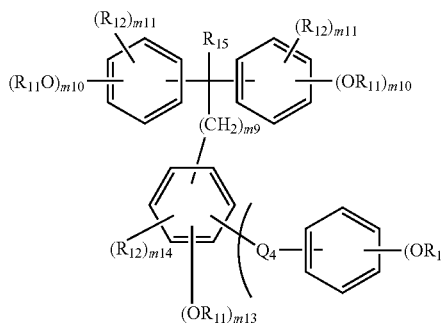

Formula (8)

In Formula (8), $R_{11}$ and $R_{12}$ are individually the same group as those defined in Formula (6). $R_{15}$ is a hydrogen atom or a $C_{1-10}$ alkyl group. $Q_4$ is a $C_{1-10}$ alkylene group. m10 is an integer of 1 to 5. m11 is an integer satisfying $0 \leq m11 \leq (5-m10)$. m14 is an integer satisfying $0 \leq m14 \leq (5-m12-m13)$. m9 is an integer of 0 to 10. m12 is an integer of 0 to 1. m13 is an integer of 0 to 5.

$R_{11}$ is a 1,2-naphthoquinone diazide group of Formula (7) or derivatives thereof in an amount of 10 to 100% by mol, preferably 50 to 100% by mol, based on the number of moles of all —$OR_{11}$ groups contained in the compound of Formula (8).

The $C_{1-10}$ alkylene group as $Q_4$ is a divalent hydrocarbon group corresponding to the above alkyl group, and as $Q_4$, a linear or branched alkylene group is used. Examples thereof include groups of Formulae ($Q_4$-1) and ($Q_4$-2):

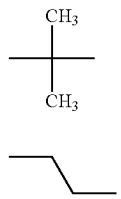

Formula ($Q_4$-1)

Formula ($Q_4$-2)

Specific examples of the compound (13) include compounds of Formulae (B-1) to (B-10):

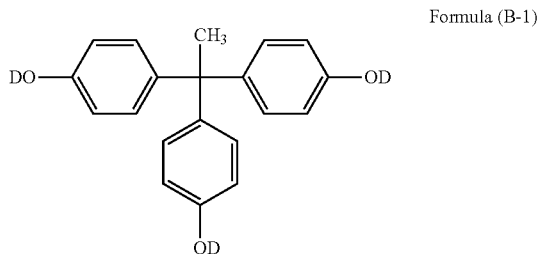

Formula (B-1)

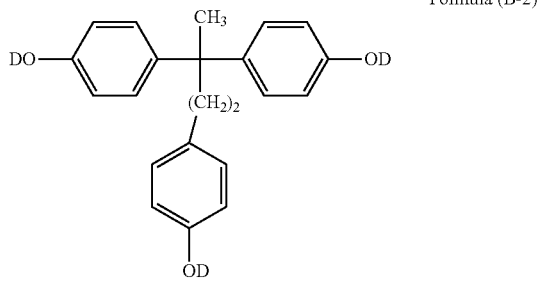

Formula (B-2)

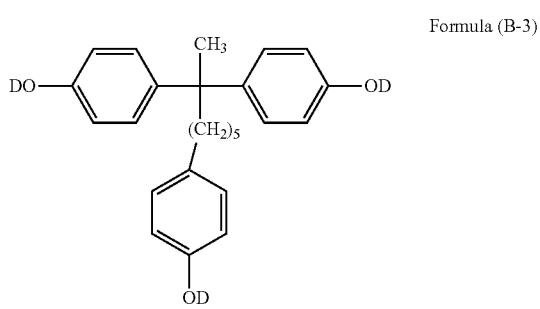

Formula (B-3)

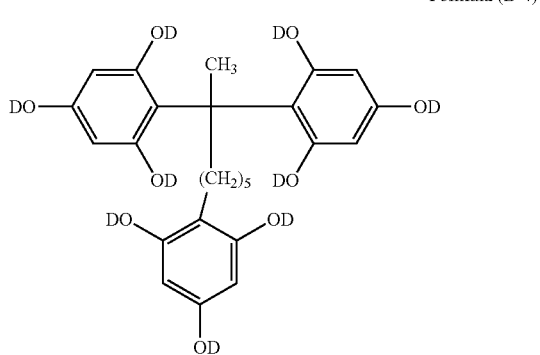

Formula (B-4)

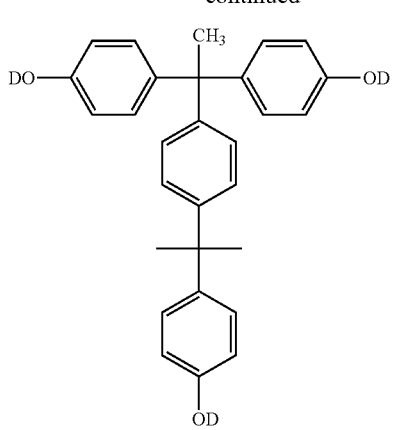

Formula (B-5)

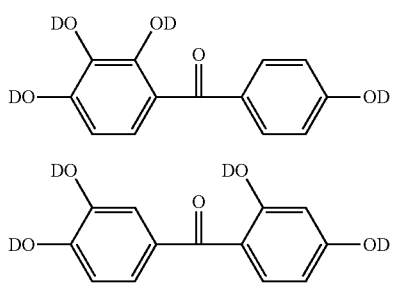

Formula (B-6)

Formula (B-7)

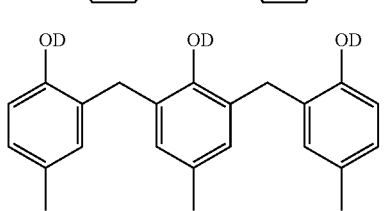

Formula (B-8)

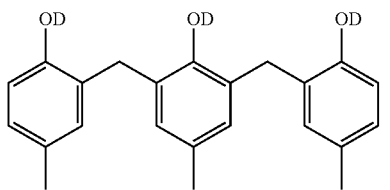

Formula (B-9)

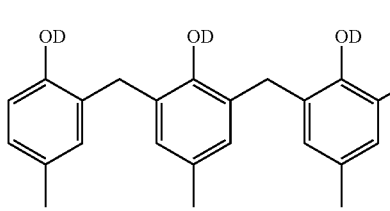

Formula (B-10)

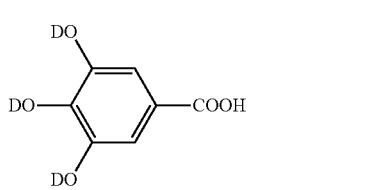

(where D (that is, $R_{11}$) is a hydrogen atom, or a 1,2-naphthoquinone diazide group of Formula (7) or derivatives thereof).

The content of the component (B) in the solid content of the positive resist composition of the present invention is 1 to 90% by mass, preferably 5 to 50% by mass, more preferably 10 to 30% by mass. When the content of the component (B) is less than 1% by mass, the difference in the solubility in an alkaline developer between an exposed portion and an unexposed portion of the cured film formed from the positive resist composition becomes small, so that the patterning by development may become difficult. On the other hand, when the content of the component (B) is more than 90% by mass, the component (B) (for example, a 1,2-naphthoquinone diazide compound) may not satisfactorily be decomposed by exposure for a short time to cause the lowering of the sensitivity, or the component (B) may absorb light to cause the lowering of transparency of the cured film.

<Component (C)>

The solvent as the component (C) is a solvent dissolving the component (A) and the component (B), and the below described crosslinkable compound as the component (D), surfactant as the component (E), adhesion accelerator as the component (F), and other additives, each of which is added to the composition if desired. So long as the solvent is a solvent having such a dissolving power, the type or the structure of the solvent is not particularly limited.

Examples of such a solvent as the component (C) include alcohols such as methanol, ethanol, propanol, and butanol; cyclic ethers such as tetrahydrofuran and dioxane; aromatic hydrocarbons such as benzene, toluene, and xylene; polar solvents such as N,N-dimethylformamide and N-methyl-2-pyrrolidone; esters such as ethyl acetate, butyl acetate, and ethyl lactate; alkoxy esters such as methyl 3-methoxypropionate, methyl 2-methoxypropionate, ethyl 3-methoxypropionate, ethyl 2-methoxypropionate, ethyl 3-ethoxypropionate, and ethyl 2-ethoxypropionate; ethers such as ethylene glycol dimethyl ether, diethylene glycol dimethyl ether, diethylene glycol diethyl ether, diethylene glycol methylethyl ether, propylene glycol dimethyl ether, and dipropylene glycol dimethyl ether; glycol dialkyl esters; glycol monoalkyl ethers such as ethylene glycol monomethyl ether, ethylene glycol monoethyl ether, diethylene glycol monomethyl ether, diethylene glycol monoethyl ether, propylene glycol monomethyl ether, propylene glycol monoethyl ether, dipropylene glycol monomethyl ether, and dipropylene glycol monoethyl ether; glycol monoalkyl ether esters such as propylene glycol monomethyl ether acetate, carbitol acetate, and ethyl cellosolve acetate; and ketones such as cyclohexanone, methyl ethyl ketone, methyl isobutyl ketone, and 2-heptanone.

These solvents may be used individually or in combination of two or more types thereof.

Among them, from the viewpoint of the safety for the work environment, propylene glycol monomethyl ether, propylene glycol monomethyl ether acetate, and ethyl lactate are preferred.

<Component (D)>

The component (D) is a crosslinkable compound having two or more substituents crosslinkable with the component (A) and is not particularly limited so long as there is no problem of the compatibility thereof with the component (A). As the crosslinker as the component (D), there can be used a crosslinkable compound having two or more, preferably two to six crosslinking-reactable groups such as an isocyanate group, an epoxy group, a hydroxymethylamino group, and an alkoxymethylamino group.

Examples of the crosslinkable compound include a compound of Formula (D-1):

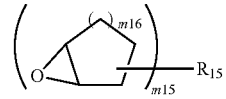

Formula (D-1)

In Formula (D-1), m15 is an integer of 2 to 10. m16 is an integer of 0 to 4. $R_{15}$ is an m15-valent organic group.

Particularly preferred is a compound of Formula (D-1) (where m15 is 2) having a cyclohexene oxide structure. Specific examples thereof include compounds of Formula (D-2) and Formula (D-3):

Formula (D-2)

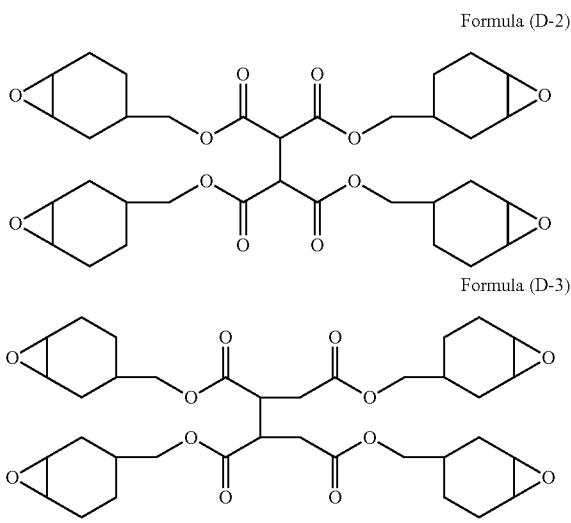

Formula (D-3)

and the commercially available products exemplified below.

Such commercially available products include: Epolead GT-401, GT-403, GT-301, GT-302, Celloxide 2021 and Celloxide 3000 (trade names; manufactured by Daicel Chemical Industries, Ltd.); and alicyclic epoxy resins such as Denacol EX-252 (trade name; manufactured by Nagase ChemteX Corporation), CY175, CY177, and CY179 (trade names; manufactured by CIBA-GEIGY A.G.), Araldite CY-182, CY-192, and CY-184 (trade names; manufactured by CIBA-GEIGY A.G.), Epiclon 200 and 400 (trade names; manufactured by Dainippon Ink & Chemicals, Inc.), and Epikote 871 and 872 (trade names; manufactured by Yuka Shell Epoxy Kabushiki Kaisha).

Among them, from the viewpoints of process resistance such as heat resistance, solvent resistance, and long-period baking resistance and transparency, preferred are compounds having a cyclohexene oxide structure such as: compounds of Formula (D-2) and Formula (D-3); Epolead GT-401, GT-403, GT-301, and GT-302; and Celloxide 2021 and Celloxide 3000 (trade names; manufactured by Daicel Chemical Industries, Ltd.).

Examples of the crosslinkable compound as the component (D) also include compounds having a partial structure of Formula (D-4):

Formula (D-4)

(where m17 is an integer of 2 to 10; and $R_{16}$ is an m17-valent organic group).

The crosslinkable compound is not particularly limited so long as the crosslinkable compound is a compound having an oxysilane structure of Formula (D-4).

Specific examples thereof include compounds of Formula (D-5):

Formula (D-5)

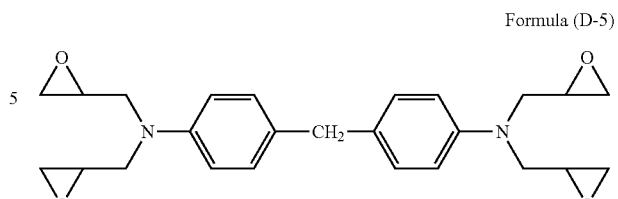

and the commercially available products exemplified below.

The commercially available products include: bisphenol A-type epoxy resins such as "Epikote 828", "Epikote 834", "Epikote 1001", and "Epikote 1004" (trade names; manufactured by Japan Epoxy Resins Co., Ltd.), and "Epiclon 850", "Epiclon 860", and "Epiclon 4055" (trade names; manufactured by Dainippon Ink & Chemicals, Inc.); bisphenol F-type epoxy resins such as "Epikote 807" (trade name; manufactured by Japan Epoxy Resins Co., Ltd.) and "Epiclon 830" (trade name; manufactured by Dainippon Ink & Chemicals, Inc.); phenol novolac-type epoxy resins such as "Epiclon N-740", "Epiclon N-770", and "Epiclon N-775" (trade names; manufactured by Dainippon Ink & Chemicals, Inc.) and "Epikote 152" and "Epikote 154" (trade names; manufactured by Japan Epoxy Resins Co., Ltd.); cresol novolac-type epoxy resins such as "Epiclon N-660", "Epiclon N-665", "Epiclon N-670", "Epiclon N-673", "Epiclon N-680", "Epiclon N-695", "Epiclon N-665-EXP", and "Epiclon N-672-EXP" (trade names; manufactured by Dainippon Ink & Chemicals, Inc.); glycidyl amine-type epoxy resins such as "Epiclon 430" and "Epiclon 430-L" (trade names; manufactured by Dainippon Ink & Chemicals, Inc.), "TETRAD-C" and "TETRAD-X" (trade names; manufactured by Mitsubishi Gas Chemical Company, Inc.), "Epikote 604" and "Epikote 630" (trade names; manufactured by Japan Epoxy Resins Co., Ltd.), "Sumiepoxy ELM 120", "Sumiepoxy ELM 100", "Sumiepoxy ELM 434", and "Sumiepoxy ELM 434 HV" (trade names; manufactured by Sumitomo Chemical Co., Ltd.), "Epotohto YH-434" and "Epotohto YH-434 L" (trade names; manufactured by Tohto Kasei Co., Ltd.), and "Araldite MY-720" (trade name; manufactured by Asahi Ciba Co., Ltd.).

Examples of the crosslinkable compound as the component (D) also include compounds having a chemical group of Formula (D-6):

Formula (D-6)

(where $R_{16}$ is a $C_{1-6}$ alkyl group or a hydrogen atom).

Examples of the $C_{1-6}$ alkyl group include a methyl group, an ethyl group, a propyl group, an isopropyl group, a butyl group, a pentyl group, and a hexyl group.

The crosslinkable compound is not particularly limited so long as the crosslinkable compound is a compound having a chemical group of Formula (D-6). Particularly preferred is a compound in which a mono-valent organic group such as a hydroxymethyl group and an alkoxymethyl group is bonded to a nitrogen atom, that is, a compound containing an N-hydroxymethyl group or an N-alkoxymethyl group. Specific examples of such a compound include compounds of Formula (D-7) and Formula (D-8):

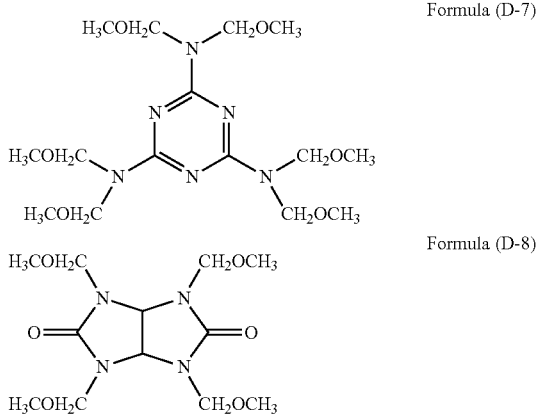

Formula (D-7)

Formula (D-8)

and the following commercially available products.

Specific examples of the compounds include hexamethoxymethylmelamine (D-7), tetramethoxymethylbenzoguanamine, 1,3,4,6-tetrakis(methoxymethyl)glycoluril (D-8), 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, 1,1,3,3-tetrakis(methoxymethyl)urea, 1,3-bis(hydroxymethyl)-4,5-dihydroxy-2-imidazolinone, and 1,3-bis(methoxymethyl)-4,5-dimethoxy-2-imidazolinone.

Specific examples of the commercially available product include, for example: methoxymethyl-type melamine compounds such as Cymel 300, Cymel 301, Cymel 303, and Cymel 350 (manufactured by Mitsui Cytec, Ltd.); butoxymethyl-type melamine compounds such as Mycoat 506 and Mycoat 508 (manufactured by Mitsui Cytec, Ltd.); glycoluril compounds such as Cymel 1170 and Powderlink 1174 (manufactured by Mitsui Cytec, Ltd.); methylated urea resins such as UFR 65 (manufactured by Mitsui Cytec, Ltd.); butylated urea resins such as UFR 300, U-VAN 10S60, U-VAN 10R, and U-VAN 11HV (manufactured by Mitsui Cytec, Ltd.); and urea/formaldehyde-based resins such as Beckamine J-300S, Beckamine P-955, and Beckamine N (manufactured by Dainippon Ink & Chemicals, Inc.).

Examples of the crosslinkable compound as the component (D) also include polymers produced using an acrylamide compound or a methacrylamide compound that are substituted with a hydroxy methyl group or an alkoxymethyl group such as N-hydroxymethylacrylamide, N-methoxymethylmethacrylamide, N-methoxymethylacrylamide, and N-butoxymethylmethacrylamide.

Examples of such a polymer include poly(N-butoxymethylacrylamide), a copolymer of N-butoxymethylacrylamide with styrene, a copolymer of N-hydroxymethylmethacrylamide with methyl methacrylate, a copolymer of N-ethoxymethylmethacrylamide with benzyl methacrylate, and a copolymer of N-butoxymethylacrylamide, benzyl methacrylate, and 2-hydroxypropyl methacrylate.

These crosslinkable compounds may be used individually or in combination of two or more types thereof.

The additive amount of the crosslinkable compound as the component (D) is 3 to 50 parts by mass, preferably 7 to 40 parts by mass, more preferably 10 to 30 parts by mass, relative to 100 parts by mass of the polymer (A). When the content of the crosslinkable compound is less than 3 parts by mass, the density of the crosslinkage formed by the crosslinkable compound is not satisfactory, so that the effect of enhancing process resistance such as heat resistance, solvent resistance, and long-period baking resistance after the pattern formation may not satisfactorily be obtained. On the other hand, when the content of the crosslinkable compound is more than 50 parts by mass, an uncrosslinked crosslinkable compound exists, so that there may be caused the lowering of the resolution, the lowering of process resistance such as heat resistance, solvent resistance, and long-period baking resistance of the cured film after the pattern formation, and the lowering of preservation stability of the positive resist composition.

<Component (E)>

The component (E) is a surfactant. In the present invention, for the purpose of enhancing applicability, a surfactant may be added to the composition. The surfactant is not particularly limited, and examples thereof include fluorinated surfactants, silicon-based surfactants, and nonionic surfactants.

As the component (E), these surfactants may be used individually or in combination of two or more types thereof.

Among these surfactants, in terms of high applicability enhancing effect, a fluorinated surfactant is preferred. Specific examples of the fluorinated surfactant include EFTOP EF 301, EF 303, and EF 352 (trade names; manufactured by Tohkem Products Co., Ltd.), MEGAFAC F 171, F 173, R-30, R-08, R-90, RL-20, and F-482 (trade names; manufactured by Dainippon Ink & Chemicals, Inc.), Fluorad FC 430 and FC 431 (trade names; manufactured by Sumitomo 3M Limited), and Asahi Guard AG 710, Surflon 5-382, SC 101, SC 102, SC 103, SC 104, SC 105, and SC 106 (trade names; manufactured by Asahi Glass Co., Ltd.), to which the specific examples are not limited.

The additive amount of the component (E) in the positive resist composition of the present invention is 0.01 to 5 parts by mass, preferably 0.01 to 3 parts by mass, more preferably 0.01 to 2 parts by mass, relative to 100 parts by mass of the polymer (A). When the additive amount of the surfactant is more than 5 parts by mass, unevenness is easily caused in the coating film. On the other hand, when the additive amount is less than 0.01 parts by mass, striation or the like is easily caused in the coating film.

<Component (F)>

The component (F) is an adhesion accelerator. To the positive resist composition of the present invention, for the purpose of enhancing the adhesion to a substrate after development, an adhesion accelerator may be added.

Examples of the adhesion accelerator include: chlorosilanes such as trimethylchlorosilane, dimethylvinylchlorosilane, methyldiphenylchlorosilane, and chloromethyldimethylchlorosilane; alkoxysilanes such as trimethylmethoxysilane, dimethyldiethoxysilane, methyldimethoxysilane, dimethylvinylethoxysilane, diphenyldimethoxysilane, and phenyltriethoxysilane; silazanes such as hexamethyldisilazane, N,N'-bis(trimethylsilyl)urea, dimethyltrimethylsilylamine, and trimethylsilylimidazole; silanes such as vinyltrichlorosilane, γ-chloropropyltrimethoxysilane, γ-aminopropyltriethoxysilane, γ-methacryloxypropyltrimethoxysilane, γ-glycidoxypropyltrimethoxysilane, and γ-(N-piperidinyl)propyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine; urea compounds such as 1,1-dimethylurea and 1,3-dimethylurea; and thiourea compounds.

As the component (F), these adhesion accelerators may be used individually or in combination of two or more types thereof. The additive amount of the adhesion accelerator is usually 20 parts by mass or less, preferably 0.01 to 10 parts by mass, more preferably 0.5 to 10 parts by mass, relative to 100 parts by mass of the component (A). When the additive amount of the adhesion accelerator is more than 20 parts by mass, heat resistance of the coating film may be lowered. On the other hand, when the additive amount is less than 0.1 parts by mass, satisfactory effect of the adhesion accelerator may not be obtained.

As other additives, if necessary, there may further be added to the composition a pigment, a dye, a preservation stabilizer, an antifoamer, a dissolution accelerator such as a polyphenol and a poly carboxylic acid, and the like.

<Positive Resist Composition>

The positive resist composition of the present invention contains the component (A): an alkali-soluble polymer containing a unit structure having a biphenyl structure, the component (B): a compound having an organic group to be photolyzed to generate an alkali-soluble group, and the component (C): a solvent, and if desired, may further contain one or more type(s) of the component (D): a crosslinkable compound, the component (E): a surfactant, the component (F): an adhesion accelerator, and other additives.

Particularly, preferred examples of the positive resist composition of the present invention include:

[1] a positive resist composition having a solid content of 3 to 50% by mass in which 10 to 90 parts by mass of the component (A) and 1 to 90% by mass of the component (B), based on the mass of the solid content, are dissolved in the component (C);

[2] a positive resist composition in which the composition of the above [1] further contains 3 to 50 parts by mass of the component (D), relative to 100 parts by mass of the component (A);

[3] a positive resist composition in which the composition of [1] or [2] further contains 0.01 to 5 parts by mass of the component (E), relative to 100 parts by mass of the component (A); and

[4] a positive resist composition in which the composition of [1], [2], or [3] further contains 20 parts by mass or less of the component (F), relative to 100 parts by mass of the component (A).

The ratio of the solid content in the positive resist composition of the present invention is not particularly limited so long as each component is homogeneously dissolved in the solvent. However, the ratio of the solid content is, for example, 3 to 50% by mass, preferably 5 to 35% by mass, more preferably 7 to 30% by mass. The solid content is a ratio of a component remaining after subtracting the solvent as the component (C) from the positive resist composition.

The content of the component (A) in the solid content is 10 to 90% by mass, preferably 40 to 90% by mass, more preferably 50 to 80% by mass. When the content of the component (A) is less than 10 parts by mass, a coating film or a cured film formed from the positive resist composition may not have a strength sufficient for functioning as a film. On the other hand, when the content of the component (A) is more than 90% by mass, the composition may be unable to contain an amount of the component (B) enough to perform a satisfactory patterning during exposure and development.

The preparing method of the positive resist composition of the present invention is not particularly limited. However, examples thereof include: a method of dissolving a component (A) in a component (C) and mixing the resultant solution with a component (B) in a predetermined ratio to prepare a homogeneous solution; and a method of further adding, if necessary, a component (D), a component (E), a component (F), or other additives to the composition to be mixed with at an appropriate step of the above preparing method.

In the preparation of the positive resist composition of the present invention, a solution of a polymer (A) obtained by a polymerization reaction in a component (C) as it is may be used, and at this time, when into the solution of the polymer (A), a component (B) or the like is charged to prepare a homogeneous solution as described above, for the purpose of the concentration adjustment, further a component (C) may additionally be charged into the solution. At this time, a component (C) used in the forming process of the polymer (A) may be the same as or different from a component (C) used for the concentration adjustment in the preparation of the positive resist composition.

<Microlens and Planarization Film>

In the present invention, in the production of the solid-state imaging device, on a photodiode (photosensitive element) disposed on a substrate, an interlayer insulating layer is disposed; thereon, a protecting film is disposed; thereon, a color filter layer composed of R/G/B is disposed; thereon, a planarization film is disposed; and thereon, a microlens is formed.

The positive resist composition of the present invention can be applied to the formation of the planarization film and the microlens.

A CMOS imaging device that is one type of imaging device contains a photo diode sensing a radiated light and a part for converting the light to an electrical signal. As the received light amount of the photodiode increases, the sensitivity of the CMOS imaging device relative to light improves. As one of light collection techniques for increasing the received light amount, there is a method using a microlens. In an upper part of a photodiode, a convex microlens made of a substance having a high light transmittance is disposed, and by refracting a path of an incident light by a microlens, it becomes possible to collect much of light on the photodiode. In this case, light parallel to a light axis of the microlens is refracted by the microlens and is focused on a predetermined position on the light axis to convert the resultant optical image into an electrical signal.

For the microlens used in an imaging device, a material having high transparency and a high refractive index is required. For enhancing the light collecting efficiency, factors of the microlens, such as the curvature and the formed height, are adjusted in consideration of the focus of the focused light. For the formation of such a microlens, a positive resist composition is used. That is, a positive resist composition is applied on a planarization film and is dried to form a positive resist layer. Then, the composition is subjected to exposure and then development to form a positive resist pattern, and then, subjected to a curing treatment by heating or the like to form a convex microlens.

The planarization film existing as an underlayer of the microlens of a solid-state imaging device or an imaging device also assumes an important role for forming a homogeneous light axis of the microlens by being formed as a homogeneous surface. Then, for collecting much more light on the photodiode, there is required a planarization film excellent in transparency and refractive index.

In a liquid crystal display device and an LED display device, on a color filter layer or a black matrix resin layer of a substrate, there is formed a planarization film assuming also a role of a protecting film.

By applying the positive resist composition of the present invention on a base material such as a glass substrate, a silicon wafer, an oxide film, a nitride film, and a substrate coated with a metal such as aluminum, molybdenum, and chromium by a rotation coating, a flow coating, a roll coating, a slit coating, a slit coating followed by a rotation coating, an inkjet coating, or the like, and by pre-drying the composition using a hot plate, an oven, or the like, a coating film can be formed. At this time, pre-drying is performed preferably under conditions of at a temperature of 80° C. to 130° C. and for 30 to 600 seconds. However, if necessary, a condition can be accordingly selected.

On the above obtained coating film, a mask having a predetermined pattern is fitted, and by irradiating the coating film with light such as an ultraviolet ray and developing the coating film with an alkaline developer, there can be obtained a relief pattern having a sharp edge face from which an exposed portion has been washed away.

The developer used at this time is not particularly limited so long as the developer is an alkaline aqueous solution. Specific examples of the developer include: an aqueous solution of an alkali metal hydroxide such as potassium hydroxide, sodium hydroxide, potassium carbonate, and sodium carbonate; an aqueous solution of quaternary ammonium hydroxide such as tetramethylammonium hydroxide, tetraethylammonium hydroxide, and choline; and an aqueous solution of an amine such as ethanolamine, propylamine, and ethylenediamine.

The alkaline developer is an aqueous solution of generally 10% by mass or less, preferably 0.1 to 3.0% by mass. To the developer, alcohols or surfactants may be added to be used, and the additive amount of these additives is preferably 0.05 to 10 parts by mass, relative to 100 parts by mass of the developer.

Among them, a 0.1 to 2.38% by mass tetramethylammonium hydroxide aqueous solution is generally used as the alkaline developer for the photoresist, so that the coating film obtained from the positive resist composition of the present invention can be developed using this solution without causing a problem of swelling.

As the developing method, any one of generally used methods such as a puddle development method, a dipping method, and a vibration immersing method may be used. At this time, the developing time is usually 15 to 180 seconds. After the development, by performing a flush washing for 20 to 90 seconds and by air-drying with compressed air or compressed nitrogen or with spinning to remove a water content on the substrate, a coating film on which a pattern is formed can be obtained. Thereafter, the whole surface of the coating film on which a pattern is formed is irradiated with light such as a ultraviolet ray produced using a high pressure mercury lamp, and by completely decomposing the component (B) (1,2-naphthoquinonediazide compound) remaining in the coating film, transparency of the coating film is enhanced. Subsequently, by heating the coating film using a hot plate, an oven, or the like, the coating film is subjected to a curing treatment (hereinafter, called as "post bake"), and thus, a microlens having an advantageous relief pattern can be obtained.

The post bake is performed by heating using a heating apparatus such as a hot plate and an oven at a predetermined temperature such as 140° C. to 250° C. for a predetermined time such as 3 to 30 minutes on a hot plate and 30 to 90 minutes in an oven.

The thus obtained microlens having an objective advantageous relief pattern is excellent in heat resistance, solvent resistance, and transparency and is suitably used particularly in a solid-state imaging device or the like.

By subjecting the coating film before the pattern formation to the post bake, a cured film can be obtained. The conditions and the method of the post bake are the same as in the above case of forming the microlens.

The thus obtained cured film is excellent in heat resistance, solvent resistance, and transparency and can suitably be used in a planarization film, an interlayer insulating film, various insulating films, and various protecting films. The obtained cured film can suitably be used particularly as a planarization film of a liquid crystal display device, an LED display device, or the like.

EXAMPLES

Hereinafter, the present invention will be further described in more detail referring to Examples which should not be construed as limiting the scope of the present invention.

Abbreviation Symbol Used in Examples

The meanings of the abbreviations used in Examples are as follows.

MAA: methacrylic acid, MAIB: dimethyl 2,2'-azobisisobutyrate, Mn: number average molecular weight, Mw: weight average molecular weight, QD 1: sensitizer (a compound in which 1.5 mol of D in Formula (B-5) is substituted with 1,2-naphthoquinone-2-diazide-5-sulfonyl chloride and 1.5 mol of D is substituted with a hydrogen atom, relative to 1 mol of the compound of Formula (B-5), QD 2: sensitizer (a compound in which 2 mol of D in Formula (B-2) is substituted with 1,2-naphthoquinone-2-diazide-5-sulfonyl chloride and 1 mol of D is substituted with a hydrogen atom, relative to 1 mol of the compound of Formula (B-2), QD 3: sensitizer (a compound in which 3.0 mol of D in Formula (B-5) is substituted with 1,2-naphthoquinone-2-diazide-5-sulfonyl chloride, relative to 1 mol of the compound of Formula (B-5)), QD 4: sensitizer (a compound in which 3.0 mol of D in Formula (B-10) is substituted with 1,2-naphthoquinone-2-diazide-5-sulfonyl chloride, relative to 1 mol of the compound of Formula (B-10)), Epolead GT-401: crosslinkable compound (trade name; manufactured by Daicel Chemical Industries, Ltd.; Formula (D-3)), Cymel 303: crosslinkable compound (trade name; manufactured by Mitsui Cytec, Ltd.; Formula (D-7)), PGME: propylene glycol monomethyl ether, PGMEA: propylene glycol monomethyl ether acetate, MEGAFAC R30: surfactant (trade name; manufactured by Dainippon Ink & Chemicals, Inc.), THF: tetrahydrofuran, TMAH: tetramethylammonium hydroxide, ARC-XHRiC-16: composition for forming a bottom antireflective coating used in a resist underlayer (trade name: manufactured by Nissan Chemical Industries, Ltd.)

[Measurement of Number Average Molecular Weight and Weight Average Molecular Weight]

The number average molecular weight (Mn) and the weight average molecular weight (Mw) of a copolymer obtained according to the following Synthesis Examples were measured using a GPC apparatus (manufactured by JASCO Corporation; Shodex (registered trademark) column KF803L and KF804L) under the condition that the elution is performed by flowing an elution solvent THF in a column (temperature: 40° C.) at 1 mL/min. The following Mn and Mw are expressed in a value converted into that of polystyrene.

Synthesis Example 1

4-Vinylbiphenyl (5.0 g) and MAA (3.0 g) used as monomer components constituting the component (A) and MAIB (0.4 g) used as a radical-polymerization initiator were subjected to a polymerization reaction in 1,4-dioxane (34.9 g) for 10 hours while stirring the reaction mixture and heating-refluxing the reaction mixture at the heating-refluxing temperature. After the completion of the reaction, the reaction solution was cooled down to room temperature and was charged into a large amount of n-hexane to precipitate a polymer, and the resultant precipitate was dried by heating at 50° C. to obtain a white powder of the component (A): the polymer (P-1) having Mn of 5,200 and Mw of 9,600.

Synthesis Example 2

4-Vinylbiphenyl (5.0 g) and MAA (3.0 g) used as monomer components constituting the component (A) and MAIB (0.4 g) used as a radical-polymerization initiator were subjected to a polymerization reaction in 1,4-dioxane (34.9 g) for 10 hours while stirring the reaction mixture and heating-refluxing the reaction mixture at the heating-refluxing temperature. After the completion of the reaction, the reaction solution was cooled down to room temperature and was charged into a large amount of n-hexane to precipitate a polymer, and the resultant precipitate was dried by heating at 50° C. to obtain a white powder of the component (A): the polymer (P-2) having Mn of 5,100 and Mw of 9,500.

Synthesis Example 3

4-Vinylbiphenyl (3.8 g), MAA (2.9 g), and styrene (0.9 g) used as monomer components constituting the component (A) and MAIB (0.4 g) used as a radical-polymerization initiator were subjected to a polymerization reaction in 1,4-dioxane (34.9 g) for 10 hours while stirring the reaction mixture and heating-refluxing the reaction mixture at the heating-refluxing temperature. After the completion of the reaction, the reaction solution was cooled down to room temperature and was charged into a large amount of n-hexane to precipitate a polymer, and the resultant precipitate was dried by heating at 50° C. to obtain a white powder of the component (A): the polymer (P-3) having Mn of 5,200 and Mw of 11,100.

Synthesis Example 4

4-Vinylbiphenyl (3.9 g) and 4-vinylbenzoic acid (3.9 g) used as monomer components constituting the component (A) and MAIB (0.4 g) used as a radical-polymerization initiator were subjected to a polymerization reaction in 1,4-dioxane (34.9 g) for 10 hours while stirring the reaction mixture and heating-refluxing the reaction mixture at the heating-refluxing temperature. After the completion of the reaction, the reaction solution was cooled down to room temperature and was charged into a large amount of n-hexane to precipitate a polymer, and the resultant precipitate was dried by heating at 50° C. to obtain a white powder of the component (A): the polymer (P-4) having Mn of 7,200 and Mw of 16,000.

Synthesis Example 5

Styrene (5.6 g) and MAA (2.0 g) used as monomer components constituting the component (A) and MAIB (0.4 g) used as a radical-polymerization initiator were subjected to a polymerization reaction in 1,4-dioxane (34.9 g) for 10 hours while stirring the reaction mixture and heating-refluxing the reaction mixture at a heating-refluxing temperature. After the completion of the reaction, the reaction solution was cooled down to room temperature and was charged into a large amount of n-hexane to precipitate a polymer, and the resultant precipitate was dried by heating at 50° C. to obtain a white powder of the component (A): the polymer (P-5) having Mn of 6,600 and Mw of 14,700.

Synthesis Example 6

4-Vinylbiphenyl (1.0 g) and MAA (4.3 g) used as monomer components constituting the component (A) and MAIB (0.3 g) used as a radical-polymerization initiator were subjected to a polymerization reaction in 1,4-dioxane (27.8 g) for 10 hours while stirring the reaction mixture and heating-refluxing the reaction mixture at the heating-refluxing temperature. After the completion of the reaction, the reaction solution was cooled down to room temperature and was charged into a large amount of n-hexane to precipitate a polymer, and the resultant precipitate was dried by heating at 50° C. to obtain a white powder of the component (A): the polymer (P-6) having Mn of 2,900 and Mw of 4,400.

Synthesis Example 7

4-Vinylbiphenyl (4.0 g) and MAA (0.2 g) used as monomer components constituting the component (A) and MAIB (0.2 g) used as a radical-polymerization initiator were subjected to a polymerization reaction in 1,4-dioxane (22.1 g) for 10 hours while stirring the reaction mixture and heating-refluxing the reaction mixture at the heating-refluxing temperature. After the completion of the reaction, the reaction solution was cooled down to room temperature and was charged into a large amount of n-hexane to precipitate a polymer, and the resultant precipitate was dried by heating at 50° C. to obtain a white powder of the component (A): the polymer (P-7) having Mn of 3,000 and Mw of 5,900.

Example 1

The component (A): 2.5 g of the polymer (P-1), the component (B): 0.75 g of QD 1, the component (C): a solvent mixture of 8.88 g of PGME and 8.88 g of PGMEA, the component (D): 0.38 g of GT-401, and the component (E): 0.01 g of MEGAFAC R30 were mixed and the resultant mixture was stirred at room temperature for 1 hour to prepare a homogeneous solution.

Example 2

The component (A): 2.5 g of the polymer (P-1), the component (B): 0.75 g of QD 1, the component (C): a solvent mixture of 8.88 g of PGME and 8.88 g of PGMEA, the component (D): 0.38 g of Cymel 303, and the component (E): 0.01 g of MEGAFAC R30 were mixed and the resultant mixture was stirred at room temperature for 1 hour to prepare a homogeneous solution.

Example 3

The component (A): 2.5 g of the polymer (P-1), the component (B): 0.75 g of QD 2, the component (C): a solvent mixture of 8.88 g of PGME and 8.88 g of PGMEA, the component (D): 0.38 g of Epolead GT-401, and the component (E): 0.01 g of MEGAFAC R30 were mixed and the resultant mixture was stirred at room temperature for 1 hour to prepare a homogeneous solution.

Example 4

The component (A): 2.5 g of the polymer (P-2), the component (B): 0.75 g of QD 3, the component (C): a solvent mixture of 8.88 g of PGME and 8.88 g of PGMEA, the component (D): 0.38 g of GT-401, and the component (E):

0.01 g of MEGAFAC R30 were mixed and the resultant mixture was stirred at room temperature for 1 hour to prepare a homogeneous solution.

Example 5

The component (A): 2.5 g of the polymer (P-3), the component (B): 0.75 g of QD 3, the component (C): a solvent mixture of 8.88 g of PGME and 8.88 g of PGMEA, the component (D): 0.38 g of GT-401, and the component (E): 0.01 g of MEGAFAC R30 were mixed and the resultant mixture was stirred at room temperature for 1 hour to prepare a homogeneous solution.

Example 6

The component (A): 2.5 g of the polymer (P-4), the component (B): 0.75 g of QD 1, the component (C): a solvent mixture of 8.88 g of PGME and 8.88 g of PGMEA, the component (D): 0.38 g of GT-401, and the component (E): 0.01 g of MEGAFAC R30 were mixed and the resultant mixture was stirred at room temperature for 1 hour to prepare a homogeneous solution.

Comparative Example 1

As the polymer of the component (A), poly(4-vinylphenol) (manufactured by Sigma-Aldrich Japan K.K.; Mn: 6,000, Mw: 11,400) was prepared to be used as the polymer (P-8).

The component (A): 2.5 g of the polymer (P-8), the component (B): 0.75 g of QD 1, the component (C): a solvent mixture of 8.88 g of PGME and 8.88 g of PGMEA, the component (D): 0.38 g of GT-401, and the component (E): 0.01 g of MEGAFAC R30 were mixed and the resultant mixture was stirred at room temperature for 1 hour to prepare a homogeneous solution.

Comparative Example 2

The component (A): 2.5 g of the polymer (P-5), the component (B): 0.75 g of QD 3, the component (C): a solvent mixture of 8.88 g of PGME and 8.88 g of PGMEA, the component (D): 0.38 g of GT-401, and the component (E): 0.01 g of MEGAFAC R30 were mixed and the resultant mixture was stirred at room temperature for 1 hour to prepare a homogeneous solution.

Reference Example 1

The component (A): 2.5 g of the polymer (P-2), the component (B): 0.75 g of QD 4, the component (C): a solvent mixture of 8.88 g of PGME and 8.88 g of PGMEA, the component (D): 0.38 g of GT-401, and the component (E): 0.01 g of MEGAFAC R30 were mixed and the resultant mixture was stirred at room temperature for 1 hour to prepare a homogeneous solution.

Reference Example 2

The component (A): 2.5 g of the polymer (P-6), the component (B): 0.75 g of QD 1, the component (C): a solvent mixture of 8.88 g of PGME and 8.88 g of PGMEA, the component (D): 0.38 g of GT-401, and the component (E): 0.01 g of MEGAFAC R30 were mixed and the resultant mixture was stirred at room temperature for 1 hour to prepare a homogeneous solution.

Reference Example 3

The component (A): 2.5 g of the polymer (P-7), the component (B): 0.75 g of QD 1, the component (C): a solvent mixture of 8.88 g of PGME and 8.88 g of PGMEA, the component (D): 0.38 g of GT-401, and the component (E): 0.01 g of MEGAFAC R30 were mixed and the resultant mixture was stirred at room temperature for 1 hour to prepare a homogeneous solution.

A cured film formed from each of the positive resist compositions obtained in Examples and Comparative Examples was subjected to measurements of the resolution, the light transmittance after baking, and the refractive index to be evaluated.

[Evaluation of Resolution]

All processes other than the following exposure process were performed using an automatic coating and developing apparatus (ACT-8; manufactured by Tokyo Electron Ltd.). ARC-XHRiC-16 was applied on a silicon wafer using a spin coater and the resultant coating film was baked at 175° C. for 60 seconds to form a bottom anti-reflective coating. On the bottom anti-reflective coating, each of the positive resist compositions obtained in Examples 1 to 6, Comparative Examples 1 and 2, and Reference Examples 1 to 3 was applied using a spin coater, and the resultant coating film was pre-baked at 80° C. for 2 minutes to form a coating film having a film thickness of 0.6 µm. The resultant coating film was irradiated with an ultraviolet ray having a wavelength of 365 nm through a test mask using an i-line stepper (NSR2205 i 12D; manufactured by Nikon Corporation). Then, the coating film was subjected to post exposure bake at 80° C. for 2 minutes, to development by a TMAH aqueous solution in a predetermined concentration (0.2 or 1.0% by mass) having a temperature of 23° C. for 50 seconds, and to ultrapure water washing to form a positive pattern. The resultant pattern was observed under a scanning electron microscope (S4100; manufactured by Hitachi High-Technologies Corporation). A pattern in which a dot pattern of 2 µm was formed in a rectangle shape without peeling was evaluated as "advantageous resolution" with "○", and a pattern in which the pattern shape was not a rectangle shape was evaluated with "ρ".

[Evaluation of Refractive Index]

On a silicon wafer, each of the positive resist compositions obtained in Example 1 and Comparative Example 1 was applied using a spin coater and the positive resist composition was pre-baked on a hot plate at 80° C. for 4 minutes to form a coating film. Then, the whole surface of the resultant coating film was irradiated with an ultraviolet light having an irradiance at a wavelength of 365 nm of 500 mJ/cm$^2$ using an ultraviolet ray irradiating apparatus (PLA-501 (F); manufactured by Canon Inc.) and the coating film was post-baked by heating the coating film at 160° C. for 5 minutes and at 200° C. for 5 minutes to form a resist having a film thickness of 0.1 µm. The refractive index of the resultant coating film relative to light having a wavelength of 633 nm was measured using an automatic ellipsometer (DVA-FLVW; manufactured by Mizojiri Optical Co., Ltd.).

[Evaluation of Transparency]

On a quartz substrate, each of the positive resist compositions obtained in Example 1 and Comparative Example 1 was applied using a spin coater and the positive resist composition was pre-baked by heating the positive resist composition on a hot plate at 80° C. for 4 minutes to form a coating film having a film thickness of 1.0 µm. Then, the whole surface of the resultant coating film was irradiated with an ultraviolet light having an irradiance at a wavelength of 365 nm of 500 mJ/cm$^2$ using an ultraviolet ray irradiating apparatus (PLA- 501 (F); manufactured by Canon Inc.) and the coating film was post-baked by heating the coating film at 160° C. for 5 minutes, at 200° C. for 5 minutes, and at 250° C. for 30 minutes. With respect to the coating film after the ultraviolet light irradiation and the coating film after the post-bake, the light transmittance relative to light having a wavelength of 400 nm was measured using an ultraviolet ray-visible spectrophotometer (UV-2550; manufactured by Shimadzu Corporation).

The result of the measurement is shown in Table 1.

| | Developer concentration (% by mass)/resolution | Refractive index | Light transmittance (%) | |
|---|---|---|---|---|
| | | | After exposure | After post-bake |
| Example 1 | 0.2/○ | 1.59 | 97 | 90 |
| Example 2 | 0.2/○ | 1.61 | 96 | 90 |
| Example 3 | 0.2/○ | 1.59 | 97 | 91 |
| Example 4 | 0.2/○ | 1.60 | 96 | 90 |
| Example 5 | 0.2/○ | 1.59 | 98 | 91 |
| Example 6 | 0.2/○ | 1.61 | 99 | 93 |
| Comparative Example 1 | 1.0/○ | 1.59 | 97 | 73 |
| Comparative Example 2 | 0.2/○ | 1.57 | 98 | 95 |
| Reference Example 1 | 0.2/○ | 1.59 | 97 | 79 |
| Reference Example 2 | 0.2/ρ | 1.56 | 98 | 90 |
| Reference Example 3 | 1.0/ρ | 1.62 | 98 | 89 |

As is apparent from the result shown in Table 1, any one of cured films formed from the positive resist compositions of Examples 1 to 6 had high resolution and a high refractive index and exhibited a high light transmittance both after exposure and after post-bake.

Though the resist formed from the composition of Comparative Example 1 had high resolution and exhibited a high refractive index, the coating film which was transparent after the ultraviolet light irradiation was colored after post-bake and the light transmittance thereof was lowered. The resist could not be developed by a 0.2% by mass developer and a developer having a high concentration of 1.0% by mass was used.

Though the resist formed from the composition of Comparative Example 2 had high resolution and exhibited a high refractive index also after post-bake and an excellent refractive index of 1.55 or more, the refractive index was a low value in comparison with those of the compositions of Examples 1 to 6.

Though the composition of Reference Example 1 had high resolution and exhibited a high refractive index, the coating film which was transparent after the ultraviolet light irradiation was colored after post-bake and the light transmittance thereof was lowered. When the coating film is not subjected to post-bake, the coating film can be used.

Though the composition of Reference Example 2 exhibited a high light transmittance also after post-bake, the resolution after development was poor in comparison with Examples. The composition exhibited a low refractive index in comparison with the compositions of Examples 1 to 6.

Though the composition of Reference Example 3 had a high refractive index and exhibited a high light transmittance also after post-bake, the resolution after development was poor in comparison with Examples.

INDUSTRIAL APPLICABILITY

The cured film formed from the positive resist composition according to the present invention is excellent in terms of transparency, heat resistance, and refractive index and is suitable for a material for forming a microlens used in a solid-state imaging device and the like and a planarization film used in a liquid crystal display device, an LED display device, and the like. The solid-state imaging device using the microlens of the present invention can be miniaturized, and is a material compatible with weatherability such as vehicle loading or the like.

The invention claimed is:

1. A microlens formed from a positive resist composition comprising:
   a component (A): an alkali-soluble polymer comprising a unit structure having a biphenyl structure;
   a component (B): a compound having an organic group to be photolyzed to generate an alkali-soluble group; and
   a component (C): a solvent;
   wherein:
   the alkali-soluble polymer as the component (A) is:
   a polymer comprising a unit structure of Formula (1):

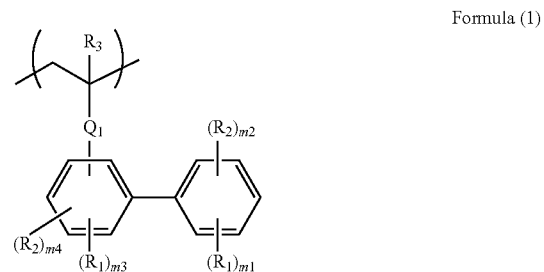

Formula (1)

where:
   $R_1$ is a halogen atom, an alkyl group, an alkoxy group, a thiol group, a cyano group, an amino group, an amide group, an alkylcarbonyl group, a thioalkyl group, or a combination thereof;
   $R_2$ is a carboxy group or a hydroxy group;
   $R_3$ is a hydrogen atom or a methyl group;
   $Q_1$ is a single bond;
   m2 is an integer of 0 to 5, m4 is an integer of 0 to 4, and (m2+m4) is an integer of 1 to 9;
   m1 is an integer satisfying $0 \le m1 \le (5-m2)$;
   m3 is an integer satisfying $0 \le m3 \le (4-m4)$; and
   when the total number of unit structures constituting the polymer (A) is assumed to be 1.0, the ratio n1 of the unit structure of Formula (1) constituting the polymer (A) satisfies $0.3 \le n1 \le 1.0$; or
   a polymer comprising a unit structure of Formula (2) and a unit structure of Formula (3):

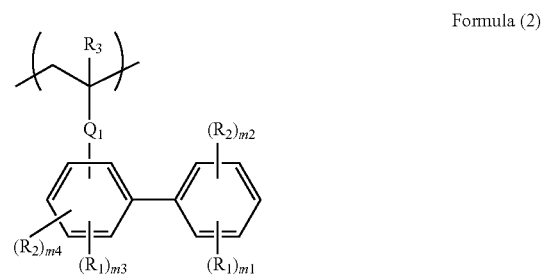

Formula (2)

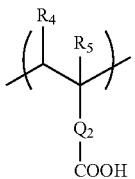

Formula (3)

where:
- $R_1$ is a halogen atom, an alkyl group, an alkoxy group, a thiol group, a cyano group, an amino group, an amide group, an alkylcarbonyl group, a thioalkyl group, or a combination thereof;
- $R_2$ is a carboxy group or a hydroxy group;
- $R_3$ is a hydrogen atom or a methyl group;
- $Q_1$ is a single bond;
- m2 is an integer of 0 to 5;
- m4 is an integer of 0 to 4;
- (m2+m4) is an integer of 0 to 9;
- m1 is an integer satisfying $0 \leq m1 \leq (5-m2)$;
- m3 is an integer satisfying $0 \leq m3 \leq (4-m4)$;
- $R_4$ and $R_5$ are individually a hydrogen atom, a methyl group, a carboxy group, or a $C_{1-3}$ alkylenecarboxy group;
- $Q_2$ is a single bond, a $C_{1-3}$ alkylene group, or a $C_{6-20}$ arylene group; and
- when the total number of all unit structures constituting the polymer (A) is assumed to be 1.0, the ratio n2 of the unit structure of Formula (2) constituting the polymer (A) and the ratio n3 of the unit structure of Formula (3) constituting the polymer (A) satisfy $0.2 \leq n2 \leq 0.8$, $0.1 \leq n3 \leq 0.7$, and $0.3 \leq n2+n3 \leq 1.0$; or a polymer comprising:
- a unit structure of Formula (1) as defined above, wherein (m2+m4) is an integer of 0,
- optionally a unit structure of Formula (4), and
- optionally a unit structure of Formula (5):

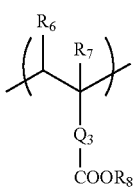

Formula (4)

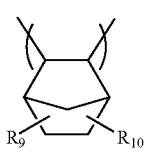

Formula (5)

where:
- $R_6$ and $R_7$ are individually a hydrogen atom, a methyl group, a carboxy group, or a $C_{1-3}$ alkylenecarboxy group;
- $R_8$ is a $C_{1-10}$ substituted or unsubstituted alkyl group, a $C_{3-6}$ epoxy group, a $C_{6-20}$ aryl group, or a combination thereof;
- $Q_3$ is a single bond, a $C_{1-3}$ alkylene group, or a $C_{6-20}$ arylene group;
- $R_9$ and $R_{10}$ are individually a $C_{1-10}$ substituted or unsubstituted alkyl group, a $C_{1-6}$ hydroxyalkyl group, a hydroxy group, a halogen group, a carboxy group, or a $C_{1-10}$ alkoxy group; and
- when the total number of all unit structures constituting the polymer (A) is assumed to be 1.0, the ratio n1 of the unit structure of Formula (1) constituting the polymer (A), the ratio n4 of the unit structure of Formula (4) constituting the polymer (A), and the ratio n5 of the unit structure of Formula (5) constituting the polymer (A) satisfy $0.3 \leq n1 \leq 0.7$, $0 \leq n4 \leq 0.4$, $0 \leq n5 \leq 0.4$, and $0.3 \leq n1+n4+n5 \leq 1.0$; or a polymer comprising:
- a unit structure of Formula (2) as defined above, wherein (m2+m4) is an integer of 0,
- a unit structure of Formula (3) as defined above,
- a unit structure of Formula (4) as defined above, and
- a unit structure of Formula (5) as defined above, wherein when the total number of all unit structures constituting the polymer (A) is assumed to be 1.0, the ratio n2 of the unit structure of Formula (2) constituting the polymer (A), the ratio n3 of the unit structure of Formula (3) constituting the polymer (A), the ratio n4 of the unit structure of Formula (4) constituting the polymer (A), and the ratio n5 of the unit structure of Formula (5) constituting the polymer (A) satisfy $0.2 \leq n2 \leq 0.8$, $0.1 \leq n3 \leq 0.7$, $0 < n4 \leq 0.4$, $0 < n5 \leq 0.4$, and $0.3 < n2+n3+n4+n5 \leq 1.0$; and the component (B) is a compound having a structure of Formula (6):

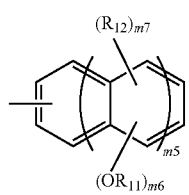

Formula (6)

where:
- $R_{11}$ is a hydrogen atom or a group of Formula (7):

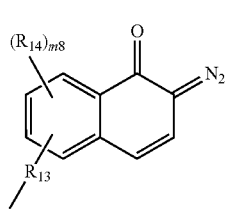

Formula (7)

where:
- $R_{13}$ is a single bond or a $-SO_2-$ group;
- $R_{14}$ is a $C_{1-10}$ alkyl group; and
- m8 is an integer of 0 to 3;
- $R_{12}$ is a $C_{1-10}$ substituted or unsubstituted alkyl group, a halogen group, or a $C_{1-10}$ alkoxy group;
- m5 is an integer of 0 or 1, where when m5 is 0, m6 is an integer of 1 to 5, and m7 is an integer satisfying $0 \leq m7 \leq (5-m6)$, and when m5 is 1, m6 is an integer of 1 to 7 and m7 is an integer satisfying $0 \leq m7 \leq (7-m6)$; and $R_{11}$ is a group of Formula (7) in an amount of 10 to 100% by mol, based on the number of moles of all —$OR_{11}$ groups contained in the structure of Formula (6).

2. A solid-state imaging device, comprising a microlens formed from a positive resist composition comprising:

a component (A): an alkali-soluble polymer comprising a unit structure having a biphenyl structure;

a component (B): a compound having an organic group to be photolyzed to generate an alkali-soluble group; and a component (C): a solvent;

wherein:

the alkali-soluble polymer as the component (A) is:

a polymer comprising a unit structure of Formula (1):

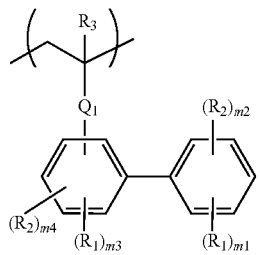

Formula (1)

where:

$R_1$ is a halogen atom, an alkyl group, an alkoxy group, a thiol group, a cyano group, an amino group, an amide group, an alkylcarbonyl group, a thioalkyl group, or a combination thereof;

$R_2$ is a carboxy group or a hydroxy group;

$R_3$ is a hydrogen atom or a methyl group;

$Q_1$ is a single bond;

m2 is an integer of 0 to 5, m4 is an integer of 0 to 4, and (m2+m4) is an integer of 1 to 9;

m1 is an integer satisfying $0 \leq m1 \leq (5-m2)$;

m3 is an integer satisfying $0 \leq m3 \leq (4-m4)$; and when the total number of unit structures constituting the polymer (A) is assumed to be 1.0, the ratio n1 of the unit structure of Formula (1) constituting the polymer (A) satisfies $0.3 \leq n1 \leq 1.0$; or a polymer comprising a unit structure of Formula (2) and a unit structure of Formula (3):

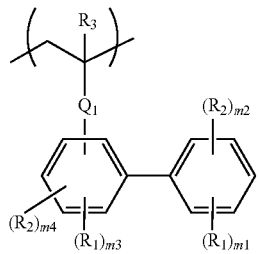

Formula (2)

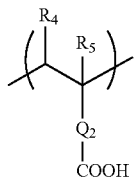

Formula (3)

where:

$R_1$ is a halogen atom, an alkyl group, an alkoxy group, a thiol group, a cyano group, an amino group, an amide group, an alkylcarbonyl group, a thioalkyl group, or a combination thereof;

$R_2$ is a carboxy group or a hydroxy group;

$R_3$ is a hydrogen atom or a methyl group;

$Q_1$ is a single bond;

m2 is an integer of 0 to 5;

m4 is an integer of 0 to 4;

(m2+m4) is an integer of 0 to 9;

m1 is an integer satisfying $0 \leq m1 \leq (5-m2)$;

m3 is an integer satisfying $0 \leq m3 \leq (4-m4)$;

$R_4$ and $R_5$ are individually a hydrogen atom, a methyl group, a carboxy group, or a $C_{1-3}$ alkylenecarboxy group;

$Q_2$ is a single bond, a $C_{1-3}$ alkylene group, or a $C_{6-20}$ arylene group; and when the total number of all unit structures constituting the polymer (A) is assumed to be 1.0, the ratio n2 of the unit structure of Formula (2) constituting the polymer (A) and the ratio n3 of the unit structure of Formula (3) constituting the polymer (A) satisfy $0.2 \leq n2 \leq 0.8$, $0.1 \leq n3 \leq 0.7$, and $0.3 \leq n2+n3 \leq 1.0$; or a polymer comprising:

a unit structure of Formula (1) as defined above, wherein (m2+m4) is an integer of 0, optionally a unit structure of Formula (4), and optionally a unit structure of Formula (5):

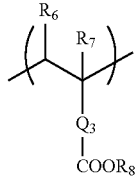

Formula (4)

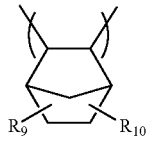

Formula (5)

where:

$R_6$ and $R_7$ are individually a hydrogen atom, a methyl group, a carboxy group, or a $C_{1-3}$ alkylenecarboxy group;

$R_8$ is a $C_{1-10}$ substituted or unsubstituted alkyl group, a $C_{3-6}$ epoxy group, a $C_{6-20}$ aryl group, or a combination thereof;

$Q_3$ is a single bond, a $C_{1-3}$ alkylene group, or a $C_{6-20}$ arylene group;

$R_9$ and $R_{10}$ are individually a $C_{1-10}$ substituted or unsubstituted alkyl group, a $C_{1-6}$ hydroxyalkyl group, a hydroxy group, a halogen group, a carboxy group, or a $C_{1-10}$ alkoxy group; and when the total number of all unit structures constituting the polymer (A) is assumed to be 1.0, the ratio n1 of the unit structure of Formula (1) constituting the polymer (A), the ratio n4 of the unit structure of Formula (4) constituting the polymer (A), and the ratio n5 of the unit structure of Formula (5) constituting the polymer (A) satisfy $0.3 \leq n1 \leq 0.7$, $0 \leq n4 \leq 0.4$, $0 \leq n5 \leq 0.4$, and $0.3 \leq n1+n4+n5 \leq 1.0$; or a polymer comprising:
a unit structure of Formula (2) as defined above, wherein (m2+m4) is an integer of 0,
a unit structure of Formula (3) as defined above,
a unit structure of Formula (4) as defined above, and
a unit structure of Formula (5) as defined above, wherein when the total number of all unit structures constituting the polymer (A) is assumed to be 1.0, the ratio n2 of the unit structure of Formula (2) constituting the polymer (A), the ratio n3 of the unit structure of Formula (3) constituting the polymer (A), the ratio n4 of the unit structure of Formula (4) constituting the polymer (A), and the ratio n5 of the unit structure of Formula (5) constituting the polymer (A) satisfy $0.2 \leq n2 \leq 0.8$, $0.1 \leq n3 \leq 0.7$, $0 < n4 \leq 0.4$, $0 < n5 \leq 0.4$, and $0.3 < n2+n3+n4+n5 \leq 1.0$; and the component (B) is a compound having a structure of Formula (6):

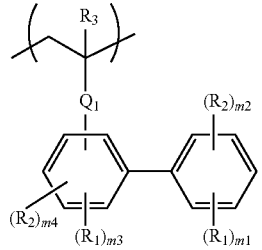

Formula (6)

where:
$R_{11}$ is a hydrogen atom or a group of Formula (7):

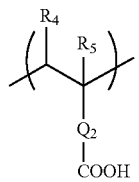

Formula (7)

where:
$R_{13}$ is a single bond or a —$SO_2$— group;
$R_{14}$ is a $C_{1-10}$ alkyl group; and
m8 is an integer of 0 to 3;
$R_{12}$ is a $C_{1-10}$ substituted or unsubstituted alkyl group, a halogen group, or a $C_{1-10}$ alkoxy group;
m5 is an integer of 0 or 1, where when m5 is 0, m6 is an integer of 1 to 5, and m7 is an integer satisfying $0 \leq m7 \leq (5-m6)$, and when m5 is 1, m6 is an integer of 1 to 7 and m7 is an integer satisfying $0 \leq m7 \leq (7-m6)$; and
$R_{11}$ is a group of Formula (7) in an amount of 10 to 100% by mol, based on the number of moles of all —$OR_{11}$ groups contained in the structure of Formula (6).

3. A liquid crystal display device, comprising a planarization film formed from a positive resist composition comprising:
a component (A): an alkali-soluble polymer comprising a unit structure having a biphenyl structure;
a component (B): a compound having an organic group to be photolyzed to generate an alkali-soluble group; and
a component (C): a solvent;

wherein:
the alkali-soluble polymer as the component (A) is:
a polymer comprising a unit structure of Formula (1):

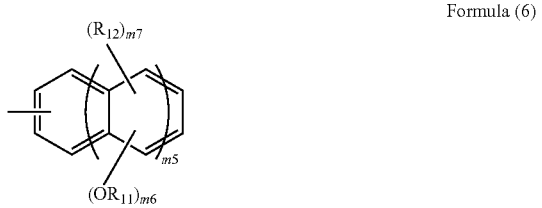

Formula (1)

where:
$R_1$ is a halogen atom, an alkyl group, an alkoxy group, a thiol group, a cyano group, an amino group, an amide group, an alkylcarbonyl group, a thioalkyl group, or a combination thereof;
$R_2$ is a carboxy group or a hydroxy group;
$R_3$ is a hydrogen atom or a methyl group;
$Q_1$ is a single bond;
m2 is an integer of 0 to 5, m4 is an integer of 0 to 4, and (m2+m4) is an integer of 1 to 9;
m1 is an integer satisfying $0 \leq m1 \leq (5-m2)$;
m3 is an integer satisfying $0 \leq m3 \leq (4-m4)$; and
when the total number of unit structures constituting the polymer (A) is assumed to be 1.0, the ratio n1 of the unit structure of Formula (1) constituting the polymer (A) satisfies $0.3 \leq n1 \leq 1.0$; or
a polymer comprising a unit structure of Formula (2) and a unit structure of Formula (3):

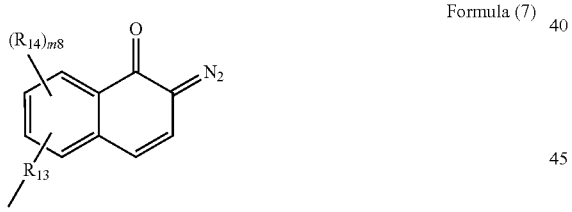

Formula (2)

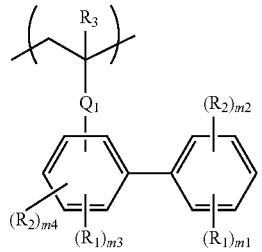

Formula (3)

where:
$R_1$ is a halogen atom, an alkyl group, an alkoxy group, a thiol group, a cyano group, an amino group, an amide group, an alkylcarbonyl group, a thioalkyl group, or a combination thereof;
$R_2$ is a carboxy group or a hydroxy group;
$R_3$ is a hydrogen atom or a methyl group;
$Q_1$ is a single bond;
m2 is an integer of 0 to 5;
m4 is an integer of 0 to 4;

(m2+m4) is an integer of 0 to 9;

m1 is an integer satisfying $0 \leq m1 \leq (5-m2)$;

m3 is an integer satisfying $0 \leq m3 \leq (4-m4)$;

$R_4$ and $R_5$ are individually a hydrogen atom, a methyl group, a carboxy group, or a $C_{1-3}$ alkylenecarboxy group;

$Q_2$ is a single bond, a $C_{1-3}$ alkylene group, or a $C_{6-20}$ arylene group; and when the total number of all unit structures constituting the polymer (A) is assumed to be 1.0, the ratio n2 of the unit structure of Formula (2) constituting the polymer (A) and the ratio n3 of the unit structure of Formula (3) constituting the polymer (A) satisfy $0.2 \leq n2 \leq 0.8$, $0.1 \leq n3 \leq 0.7$, and $0.3 \leq n2+n3 \leq 1.0$; or a polymer comprising:

a unit structure of Formula (1) as defined above, wherein (m2+m4) is an integer of 0, optionally a unit structure of Formula (4), and optionally a unit structure of Formula (5):

Formula (4)

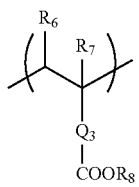

Formula (5)

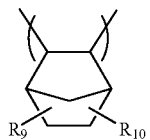

where:

$R_6$ and $R_7$ are individually a hydrogen atom, a methyl group, a carboxy group, or a $C_{1-3}$ alkylenecarboxy group;

$R_8$ is a $C_{1-10}$ substituted or unsubstituted alkyl group, a $C_{3-6}$ epoxy group, a $C_{6-20}$ aryl group, or a combination thereof;

$Q_3$ is a single bond, a $C_{1-3}$ alkylene group, or a $C_{6-20}$ arylene group;

$R_9$ and $R_{10}$ are individually a $C_{1-10}$ substituted or unsubstituted alkyl group, a $C_{1-6}$ hydroxyalkyl group, a hydroxy group, a halogen group, a carboxy group, or a $C_{1-10}$ alkoxy group; and when the total number of all unit structures constituting the polymer (A) is assumed to be 1.0, the ratio n1 of the unit structure of Formula (1) constituting the polymer (A), the ratio n4 of the unit structure of Formula (4) constituting the polymer (A), and the ratio n5 of the unit structure of Formula (5) constituting the polymer (A) satisfy $0.3 \leq n1 \leq 0.7$, $0 \leq n4 \leq 0.4$, $0 \leq n5 \leq 0.4$, and $0.3 \leq n1+n4+n5 \leq 1.0$; or a polymer comprising:

a unit structure of Formula (2) as defined above, wherein (m2+m4) is an integer of 0, a unit structure of Formula (3) as defined above, a unit structure of Formula (4) as defined above, and a unit structure of Formula (5) as defined above, wherein when the total number of all unit structures constituting the polymer (A) is assumed to be 1.0, the ratio n2 of the unit structure of Formula (2) constituting the polymer (A), the ratio n3 of the unit structure of Formula (3) constituting the polymer (A), the ratio n4 of the unit structure of Formula (4) constituting the polymer (A), and the ratio n5 of the unit structure of Formula (5) constituting the polymer (A) satisfy $0.2 \leq n2 \leq 0.8$, $0.1 \leq n3 \leq 0.7$, $0 \leq n4 \leq 0.4$, $0 \leq n5 \leq 0.4$, and $0.3 \leq n1+n4+n5 \leq 1.0$; and the component (B) is a compound having a structure of Formula (6):

Formula (6)

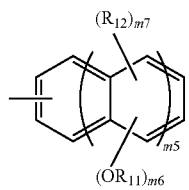

where:

$R_{11}$ is a hydrogen atom or a group of Formula (7):

Formula (7)

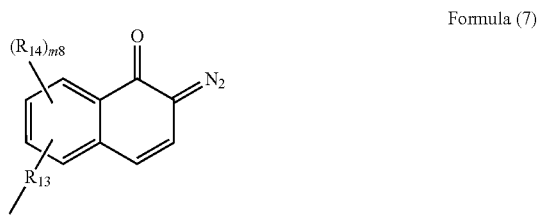

where:

$R_{13}$ is a single bond or a —$SO_2$— group;

$R_{14}$ is a $C_{1-10}$ alkyl group; and m8 is an integer of 0 to 3;

$R_{12}$ is a $C_{1-10}$ substituted or unsubstituted alkyl group, a halogen group, or a $C_{1-10}$ alkoxy group;

m5 is an integer of 0 or 1, where when m5 is 0, m6 is an integer of 1 to 5, and m7 is an integer satisfying $0 \leq m7 \leq (5-m6)$, and when m5 is 1, m6 is an integer of 1 to 7 and m7 is an integer satisfying $0 \leq m7 \leq (7-m6)$; and $R_{11}$ is a group of Formula (7) in an amount of 10 to 100% by mol, based on the number of moles of all —$OR_{11}$ groups contained in the structure of Formula (6).

4. An LED display device, comprising a planarization film formed from a positive resist composition comprising:

a component (A): an alkali-soluble polymer comprising a unit structure having a biphenyl structure;

a component (B): a compound having an organic group to be photolyzed to generate an alkali-soluble group; and a component (C): a solvent;

wherein:

the alkali-soluble polymer as the component (A) is:

a polymer comprising a unit structure of Formula (1):

Formula (1)

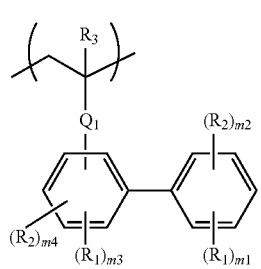

where:
R$_1$ is a halogen atom, an alkyl group, an alkoxy group, a thiol group, a cyano group, an amino group, an amide group, an alkylcarbonyl group, a thioalkyl group, or a combination thereof;
R$_2$ is a carboxy group or a hydroxy group;
R$_3$ is a hydrogen atom or a methyl group;
Q$_1$ is a single bond;
m2 is an integer of 0 to 5, m4 is an integer of 0 to 4, and (m2+m4) is an integer of 1 to 9;
m1 is an integer satisfying 0≤m1≤(5−m2);
m3 is an integer satisfying 0≤m3≤(4−m4); and
when the total number of unit structures constituting the polymer (A) is assumed to be 1.0, the ratio n1 of the unit structure of Formula (1) constituting the polymer (A) satisfies 0.3≤n1≤1.0; or
a polymer comprising a unit structure of Formula (2) and a unit structure of Formula (3):

Formula (2)

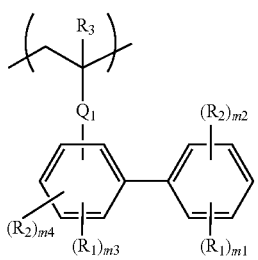

Formula (3)

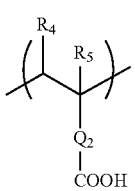

where:
R$_1$ is a halogen atom, an alkyl group, an alkoxy group, a thiol group, a cyano group, an amino group, an amide group, an alkylcarbonyl group, a thioalkyl group, or a combination thereof;
R$_2$ is a carboxy group or a hydroxy group;
R$_3$ is a hydrogen atom or a methyl group;
Q$_1$ is a single bond;
m2 is an integer of 0 to 5;
m4 is an integer of 0 to 4;
(m2+m4) is an integer of 0 to 9;
m1 is an integer satisfying 0≤m1≤(5−m2);
m3 is an integer satisfying 0≤m3≤(4−m4);
R$_4$ and R$_5$ are individually a hydrogen atom, a methyl group, a carboxy group, or a C$_{1-3}$ alkylenecarboxy group;
Q$_2$ is a single bond, a C$_{1-3}$ alkylene group, or a C$_{6-20}$ arylene group; and
when the total number of all unit structures constituting the polymer (A) is assumed to be 1.0, the ratio n2 of the unit structure of Formula (2) constituting the polymer (A) and the ratio n3 of the unit structure of Formula (3) constituting the polymer (A) satisfy 0.2≤n2≤0.8, 0.1≤n3≤0.7, and 0.3≤n2+n3≤1.0; or
a polymer comprising:
a unit structure of Formula (1) as defined above, wherein (m2+m4) is an integer of 0,
optionally a unit structure of Formula (4), and
optionally a unit structure of Formula (5):

Formula (4)

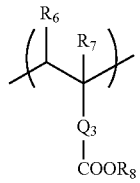

Formula (5)

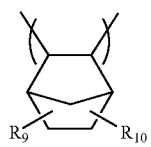

where:
R$_6$ and R$_7$ are individually a hydrogen atom, a methyl group, a carboxy group, or a C$_{1-3}$ alkylenecarboxy group;
R$_8$ is a C$_{1-10}$ substituted or unsubstituted alkyl group, a C$_{3-6}$ epoxy group, a C$_{6-20}$ aryl group, or a combination thereof;
Q$_3$ is a single bond, a C$_{1-3}$ alkylene group, or a C$_{6-20}$ arylene group;
R$_9$ and R$_{10}$ are individually a C$_{1-10}$ substituted or unsubstituted alkyl group, a C$_{1-6}$ hydroxyalkyl group, a hydroxy group, a halogen group, a carboxy group, or a C$_{1-10}$ alkoxy group; and
when the total number of all unit structures constituting the polymer (A) is assumed to be 1.0, the ratio n1 of the unit structure of Formula (1) constituting the polymer (A), the ratio n4 of the unit structure of Formula (4) constituting the polymer (A), and the ratio n5 of the unit structure of Formula (5) constituting the polymer (A) satisfy 0.3≤n1≤0.7, 0≤n4≤0.4, 0≤n5≤0.4, and 0.3≤n1+n4+n5≤1.0; or
a polymer comprising:
a unit structure of Formula (2) as defined above, wherein (m2+m4) is an integer of 0,
a unit structure of Formula (3) as defined above,
a unit structure of Formula (4) as defined above, and
a unit structure of Formula (5) as defined above, wherein when the total number of all unit structures constituting the polymer (A) is assumed to be 1.0, the ratio n2 of the unit structure of Formula (2) constituting the polymer (A), the ratio n3 of the unit structure of Formula (3) constituting the polymer (A), the ratio n4 of the unit structure of Formula (4) constituting the polymer (A), and the ratio n5 of the unit structure of Formula (5) constituting the polymer (A) satisfy 0.2≤n2≤0.8, 0.1≤n3≤0.7, 0<n4≤0.4, 0<n5≤0.4, and 0.3<n2+n3+n4+n5≤1.0; and
the component (B) is a compound having a structure of Formula (6):

Formula (6)

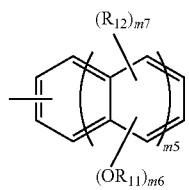

where:

$R_{11}$ is a hydrogen atom or a group of Formula (7):

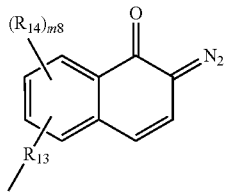

Formula (7)

where:
- $R_{13}$ is a single bond or a —$SO_2$— group;
- $R_{14}$ is a $C_{1-10}$ alkyl group; and
- m8 is an integer of 0 to 3;
- $R_{12}$ is a $C_{1-10}$ substituted or unsubstituted alkyl group, a halogen group, or a $C_{1-10}$ alkoxy group;
- m5 is an integer of 0 or 1, where when m5 is 0, m6 is an integer of 1 to 5, and m7 is an integer satisfying $0 \leq m7 \leq (5-m6)$, and when m5 is 1, m6 is an integer of 1 to 7 and m7 is an integer satisfying $0 \leq m7 \leq (7-m6)$; and
- $R_{11}$ is a group of Formula (7) in an amount of 10 to 100% by mol, based on the number of moles of all —$OR_{11}$ groups contained in the structure of Formula (6).

* * * * *